US012581641B2

(12) United States Patent
Wu et al.

(10) Patent No.: US 12,581,641 B2
(45) Date of Patent: Mar. 17, 2026

(54) MEMORY CELL, MEMORY AND METHOD FOR MANUFACTURING MEMORY

(71) Applicant: CHANGXIN MEMORY TECHNOLOGIES, INC., Hefei City (CN)

(72) Inventors: Gongyi Wu, Hefei City (CN); Xiaoling Wang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 412 days.

(21) Appl. No.: 18/179,740

(22) Filed: Mar. 7, 2023

(65) Prior Publication Data

US 2023/0209807 A1    Jun. 29, 2023

Related U.S. Application Data

(63) Continuation of application No. PCT/CN2022/077310, filed on Feb. 22, 2022.

(30) Foreign Application Priority Data

Dec. 9, 2021    (CN) .......................... 202111516468.2

(51) Int. Cl.
*H10B 12/00* (2023.01)
*H10D 64/27* (2025.01)

(52) U.S. Cl.
CPC ........... *H10B 12/315* (2023.02); *H10B 12/03* (2023.02); *H10B 12/05* (2023.02); *H10B 12/482* (2023.02);
(Continued)

(58) Field of Classification Search
CPC ...... H10B 12/315; H10B 12/03; H10B 12/05; H10B 12/482; H10B 12/488;
(Continued)

(56) References Cited

U.S. PATENT DOCUMENTS 5,801,396 A * 9/1998 Chan ...................... H10B 10/00
257/65
6,709,915 B2 3/2004 Lee
(Continued)

FOREIGN PATENT DOCUMENTS

CN 113764417 A 12/2021

OTHER PUBLICATIONS

International Search Report of the international application No. PCT/CN2022/077310, mailed on Aug. 30, 2022.

*Primary Examiner* — Yasser A Abdelaziez
(74) *Attorney, Agent, or Firm* — Syncoda LLC; Feng Ma

(57) ABSTRACT

A memory cell includes a transistor, a storage node contact and a capacitor that are connected sequentially, wherein the capacitor includes a lower electrode, an upper electrode and a dielectric layer disposed between the lower electrode and the upper electrode. The lower electrode includes: a first electrode layer having a first sub-electrode region and a plurality of second sub-electrode regions connected to the first sub-electrode region, where the first sub-electrode region is in contact with a surface of the storage node contact, each of the second sub-electrode regions extends along a direction away from the storage node contact and has a first end face and a second end face facing each other in an extension direction, the first end face being in contact with the surface of the storage node contact; and a second electrode layer, covering at least part of a surface of the first electrode layer.

6 Claims, 45 Drawing Sheets

(52) U.S. Cl.
CPC ......... *H10B 12/488* (2023.02); *H10D 64/513*
(2025.01)

(58) Field of Classification Search
CPC .. H10B 12/0335; H10B 12/31; H10D 64/513;
H10D 1/716
See application file for complete search history.

(56) References Cited

U.S. PATENT DOCUMENTS

| | | | |
|---|---|---|---|
| 6,812,542 B2 | 11/2004 | Kohyama | |
| 7,074,669 B2 | 7/2006 | Iijima | |
| 8,508,982 B2 | 8/2013 | Ohgami | |
| 10,892,262 B2 | 1/2021 | Moon | |
| 2002/0003280 A1 | 1/2002 | Kohyama | |
| 2002/0179948 A1 | 12/2002 | Lee | |
| 2003/0214872 A1* | 11/2003 | Tu ........................ | H10B 12/485 |
| | | | 257/E27.087 |
| 2003/0224571 A1 | 12/2003 | Iijima | |
| 2006/0092689 A1* | 5/2006 | Braun ...................... | G11C 7/14 |
| | | | 365/158 |
| 2007/0040203 A1* | 2/2007 | Lee ........................ | H10D 1/696 |
| | | | 257/303 |
| 2011/0292717 A1 | 12/2011 | Ohgami | |
| 2020/0395436 A1 | 12/2020 | Jung et al. | |
| 2021/0384194 A1 | 12/2021 | Woo et al. | |
| 2022/0123103 A1 | 4/2022 | Jung et al. | |

* cited by examiner

311

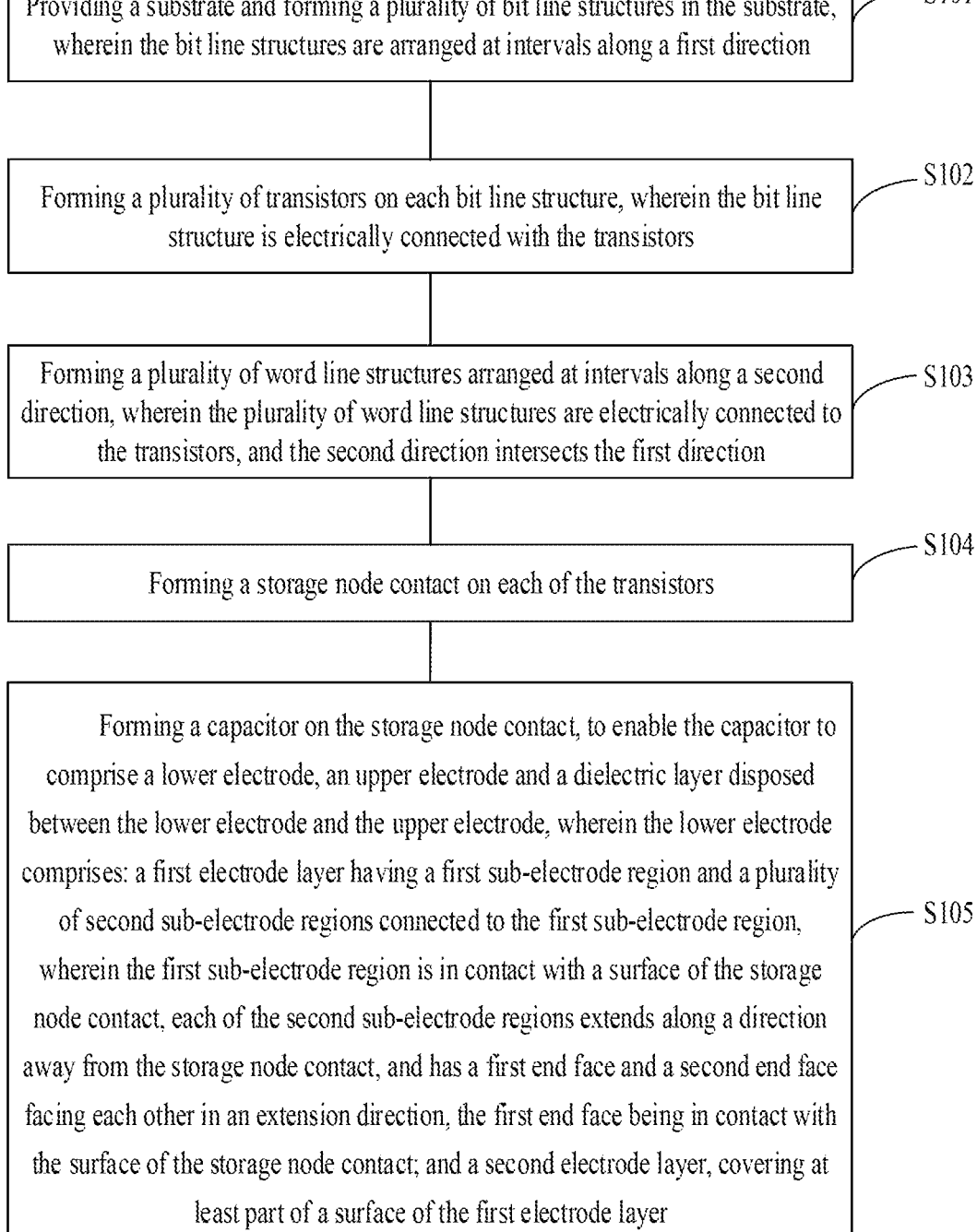

Providing a substrate and forming a plurality of bit line structures in the substrate, wherein the bit line structures are arranged at intervals along a first direction ⎯ S101

Forming a plurality of transistors on each bit line structure, wherein the bit line structure is electrically connected with the transistors ⎯ S102

Forming a plurality of word line structures arranged at intervals along a second direction, wherein the plurality of word line structures are electrically connected to the transistors, and the second direction intersects the first direction ⎯ S103

Forming a storage node contact on each of the transistors ⎯ S104

Forming a capacitor on the storage node contact, to enable the capacitor to comprise a lower electrode, an upper electrode and a dielectric layer disposed between the lower electrode and the upper electrode, wherein the lower electrode comprises: a first electrode layer having a first sub-electrode region and a plurality of second sub-electrode regions connected to the first sub-electrode region, wherein the first sub-electrode region is in contact with a surface of the storage node contact, each of the second sub-electrode regions extends along a direction away from the storage node contact, and has a first end face and a second end face facing each other in an extension direction, the first end face being in contact with the surface of the storage node contact; and a second electrode layer, covering at least part of a surface of the first electrode layer ⎯ S105

FIG. 6

MEMORY CELL, MEMORY AND METHOD FOR MANUFACTURING MEMORY

CROSS-REFERENCE TO RELATED APPLICATIONS

This application is a continuation of International Patent Application No. PCT/CN2022/077310, filed on Feb. 22, 2022, which claims priority to Chinese Patent Application No. 202111516468.2, filed on Dec. 9, 2021. The disclosures of these applications are hereby incorporated by reference in their entirety.

BACKGROUND

A Dynamic Random Access Memory (DRAM) cell includes a capacitor configured to store charges and a transistor configured to access the capacitor. A DRAM stores data in a form of charges on the capacitor, so it is necessary to recharge the capacitor regularly every few milliseconds. The larger the capacitance of the capacitor is, the longer the data stored in DRAM can be maintained.

In order to manufacture more chips on a wafer, one method is size reduction, and the other method is changing a structure. At present, the DRAM mainly has a 6F2 structure. When the size is reduced to a certain extent, a new era will be opened for a 4F2 structure. In the 4F2 structure, a structure of the capacitor has also changed accordingly. At present, the capacitor is mainly a stacked capacitor. The stacked capacitor often occupies a large chip area and forms a high capacitor height in order to ensure high storage capacity, which will not only hinder the improvement of integration, but also lead to bending and collapse. Thus, it is very important to improve the stacked capacitor structure and provide a new 3D cylindrical capacitor structure, especially with the development of 4F2 structure.

SUMMARY

The disclosure relates to the technical field of semiconductors, and in particular to, a memory cell, a memory and a method for manufacturing a memory.

The main purpose of the present disclosure is to provide a memory cell, a memory and a method for manufacturing a memory, so as to solve the problem in the prior art that the integration level is difficult to be improved because of the limitation on the size of a capacitor of a DRAM.

In order to achieve the above purpose, according to one aspect of the present disclosure, a memory cell is provided. The memory cell includes a transistor, a storage node contact and a capacitor that are connected sequentially, where the capacitor includes a lower electrode, an upper electrode and a dielectric layer disposed between the lower electrode and the upper electrode. The lower electrode includes a first electrode layer having a first sub-electrode region and a plurality of second sub-electrode regions connected to the first sub-electrode region, where the first sub-electrode region is in contact with a surface of the storage node contact, each of the second sub-electrode regions extends along a direction away from the storage node contact and has a first end face and a second end face facing each other in an extension direction, the first end face being in contact with the surface of the storage node contact; and a second electrode layer, covering at least part of a surface of the first electrode layer.

According to another aspect of the present disclosure, there is provided a memory, including: a plurality of memory cells; multiple bit line structures arranged at intervals along a first direction; and multiple word line structures arranged at intervals along a second direction. Each memory cell includes a transistor, a storage node contact and a capacitor that are connected sequentially, where the capacitor includes a lower electrode, an upper electrode and a dielectric layer disposed between the lower electrode and the upper electrode, the lower electrode comprising: a first electrode layer having a first sub-electrode region and a plurality of second sub-electrode regions connected to the first sub-electrode region, where the first sub-electrode region is in contact with a surface of the storage node contact, each of the second sub-electrode regions extends along a direction away from the storage node contact and has a first end face and a second end face facing each other in an extension direction, the first end face being in contact with the surface of the storage node contact; and a second electrode layer, covering at least part of a surface of the first electrode layer; and where the memory cells being arranged in an array. The multiple bit line structures are electrically connected to transistors in multiple memory cells; and the multiple word line structures are electrically connected to the transistors, and the second direction intersects the first direction.

According to another aspect of the present disclosure, there is provided a method for manufacturing a memory, including: providing a substrate and forming multiple bit line structures in the substrate, where the bit line structures are arranged at intervals along a first direction; forming multiple transistors on each bit line structure, where the bit line structure is electrically connected with the transistors; forming multiple word line structures arranged at intervals along a second direction, where multiple word line structures are electrically connected with the transistors, and the second direction intersects the first direction; forming a storage node contact on each of the transistors; forming a capacitor on the storage node contact, to enable the capacitor to include a lower electrode, an upper electrode and a dielectric layer disposed between the lower electrode and the upper electrode, where the lower electrode includes: a first electrode layer having a first sub-electrode region and multiple second sub-electrode regions connected to the first sub-electrode region, where the first sub-electrode region is in contact with a surface of the storage node contact, each of the second sub-electrode regions extends along a direction away from the storage node contact, and has a first end face and a second end face facing each other in an extension direction, the first end face being in contact with the surface of the storage node contact; and a second electrode layer, covering at least part of a surface of the first electrode layer.

BRIEF DESCRIPTION OF THE DRAWINGS

The drawings described herein are used to provide a further understanding of the disclosure and form a part of the disclosure. The schematic embodiments of the disclosure and the description thereof are used to explain the disclosure and do not constitute an improper limitation of the disclosure. In the drawings:

FIG. 6 is a flowchart of a method for manufacturing a DRAM according to an embodiment of the present disclosure;

FIG. 23B is covered with a capacitive material layer, respectively;

FIG. 24B is etched to form a capacitor pillar in contact with a storage node contact, respectively;

FIG. 25B is formed, respectively;

FIG. 27B is formed and the second electrode material layer is etched to form a second electrode layer, respectively;

FIG. 28B is formed, respectively;

FIG. 29B is covered with a third electrode layer, respectively; FIG. 30B is covered with a fourth electrode layer, respectively.

Figure 1:
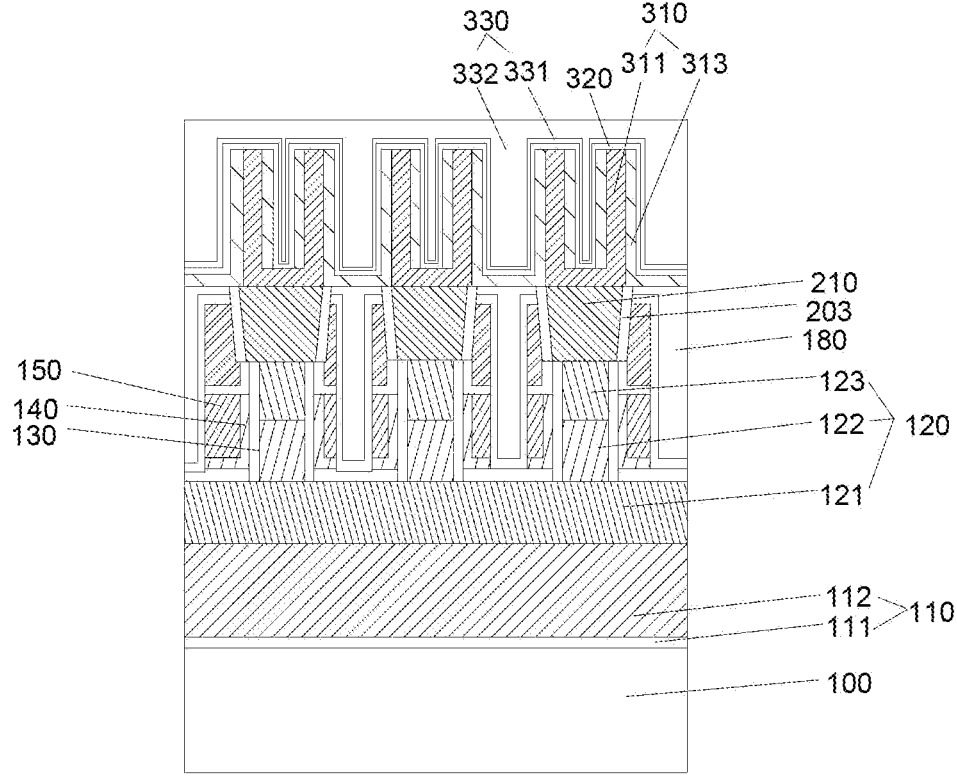
FIG. 1 is a cross-sectional structural diagram of a memory cell in an A-A' direction according to an embodiment of the present disclosure.

The above drawings include the following reference numerals:

100, substrate; 101, first mask layer; 102, etching stop layer; 103, first insulating layer; 104, second mask layer; 105, first oxide isolation; 106, etching buffer layer; 107, third mask layer; 108, patterned photoresist layer; 110, bit line structure; 111, first conductive layer; 112, second conductive layer; 120, active region structure; 121, first doped region; 122, channel region; 123, second doped region; 130, gate dielectric layer; 140, gate barrier layer; 141, barrier material; 150, gate structure; 151, gate metal; 160, second insulating layer; 170, second oxide isolation; 180, third insulating layer; 190, word line structure; 201, fourth mask layer; 202, groove; 203, silicon nitride layer; 210, storage node contact; 301, capacitive material layer; 302, capacitor pillar; 303, fourth insulating layer; 310, lower electrode; 311, first electrode layer; 3111, first sub-electrode region; 3112, second sub-electrode region; 313, second electrode layer; 320, dielectric layer; 330, upper electrode; 331, third electrode layer; 332, fourth electrode layer.

DETAILED DESCRIPTION

It should be noted that the embodiments in the present disclosure and the features in the embodiments can be combined with each other without conflict. The present disclosure will be described in detail below with reference to the accompanying drawings and in conjunction with embodiments.

In order for those skilled in the art to have a better understanding of the present disclosure, a clear and complete description of the embodiments of the present disclosure will be given below in conjunction with the accompanying drawings in the embodiments of the present disclosure, and it will be apparent that the described embodiments are only a part of the embodiments of the present disclosure, and not all of the embodiments. Based on the embodiments in the present disclosure, all other embodiments obtained by those skilled in the art without making creative efforts should fall within the scope of protection of the present disclosure.

The terms "first", "second", etc. in the specification and claims of the present disclosure and in the above drawings are used for distinguishing similar objects and not necessarily for describing a specific sequence or sequential order. It is to be understood that such used data may be interchangeable under an appropriate circumstance, so that the embodiments of the present disclosure described herein are, for example, capable of being implemented in a sequence other than those illustrated or described herein. In addition, the terms "including" and "having" and any variations of them, are intended to cover a non-exclusive inclusion, such that a process, method, system, product, or device that includes a series of steps or units need not be limited to clearly list those steps or units, but may include other steps or units that are not clearly listed or inherent to such processes, methods, products, or devices.

The present disclosure provides a memory cell, as illustrated in FIG. 1 to FIG. 5. The memory cell includes a transistor, a storage node contact 210 and a capacitor that are connected sequentially. The capacitor includes a lower electrode 310, an upper electrode 330, and a dielectric layer 320 disposed between the lower electrode 310 and the upper electrode 330. The lower electrode 310 includes a first electrode layer 311 and a second electrode layer 313.

The first electrode layer 311 has a first sub-electrode region 3111 and multiple second sub-electrode regions 3112 connected to the first sub-electrode region 3111, where the first sub-electrode region 3111 is in contact with a surface of the storage node contact, each of the second sub-electrode regions 3112 extends along a direction away from the storage node contact 210 and has a first end face and a second end face facing each other in an extension direction, the first end face being in contact with the surface of the storage node contact 210.

The second electrode layer 313 covers at least part of a surface of the first electrode layer 311.

With the memory cell of the present disclosure, the structure of the lower electrode 310, the dielectric layer 320 and the upper electrode 330 form a double-sided capacitor structure, thereby increasing an area of the capacitor. The double-sided capacitor structure can increase the storage capacity of a capacitor without increasing the size of the capacitor, thereby facilitating the integration of capacitors.

Figure 3:
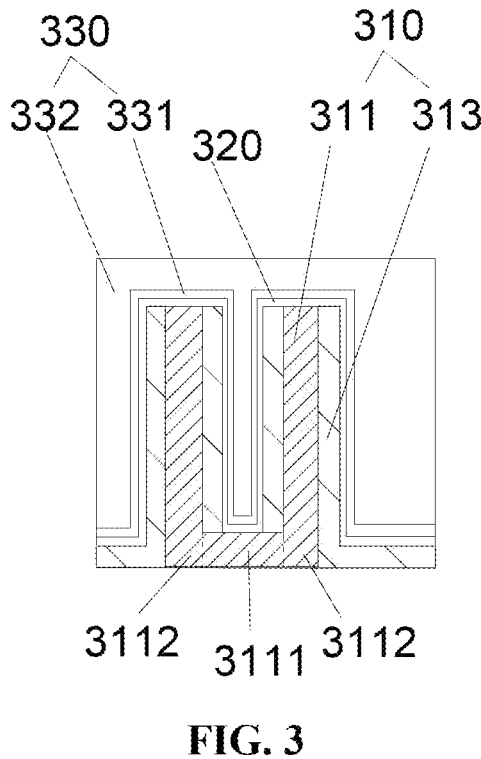
FIG. 3 is a schematic diagram illustrating cross-sectional structures of an upper electrode, a lower electrode and a dielectric layer illustrated in FIG. 1 and FIG. 2.
Figure 4:
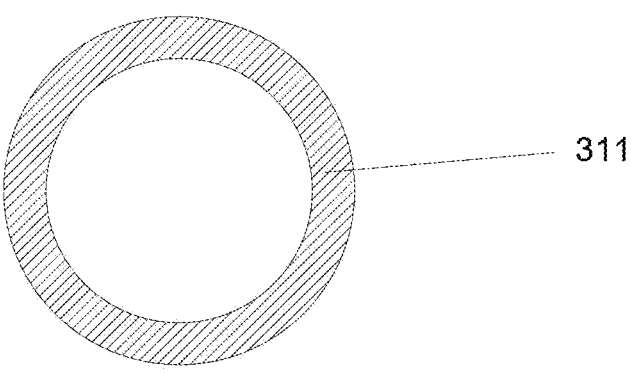
FIG. 4 is a top view of a first sub-electrode region in the lower electrode illustrated in FIG. 3.
Figure 5:
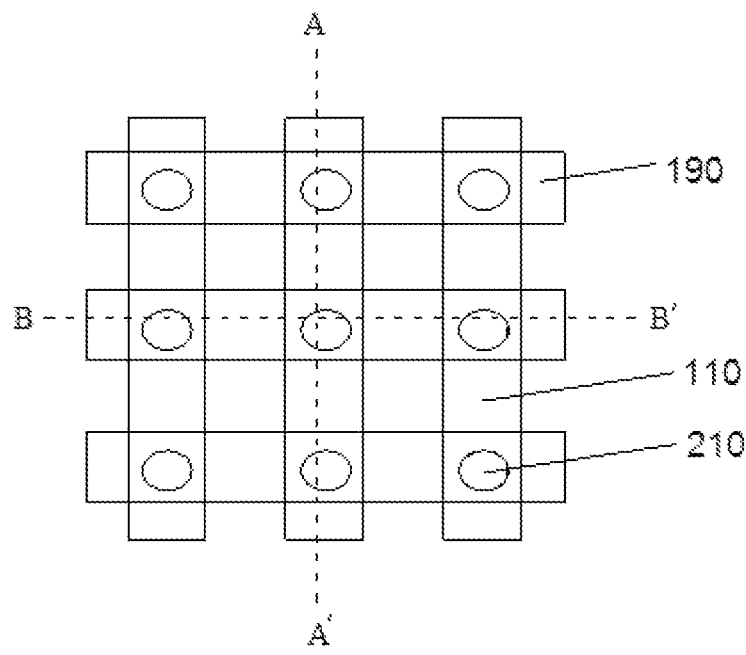
FIG. 5 is a top view of a DRAM memory having a memory cell illustrated in FIG. 1 and FIG. 2.

The second electrode layer 313 covers a part of the surface of the first electrode layer 311, for example, the second electrode layer 313 covers sidewalls of the second sub-electrode region 3112, the first sub-electrode region 3111 has a third end face away from the storage node contact 210, and the dielectric layer 320 covers the second electrode layer 313, the second end face of the second sub-electrode region 3112, and the third end face of the first sub-electrode region 3111, as illustrated in FIG. 3 and FIG. 4. The capacitor structure can increase the storage capacity of a capacitor without increasing the size of the capacitor, thereby improving the storage performance of the memory cell.

In the memory cell of the present disclosure, the upper electrode 330 includes a third electrode layer 331 covering the dielectric layer 320 and a fourth electrode layer 332 covering the third electrode layer 331.

A material for forming the upper electrode 330 may be same as a material for forming the lower electrode 310. Specifically, for example, the first electrode layer 311 and the fourth electrode layer 332 may be composed of silicon germanium having a large area; and the second electrode layer 313 and the third electrode layer 331 may be composed of thin titanium nitride. The dielectric layer 320 may be made of a dielectric material with high dielectric constant, such as $HfO_2$, $Al_2O_3$, $HfSiO_z$, $HfON$, $HfAlO_z$, $ZrO_2$, $ZrSiO_z$, $Ta_2O_5$, $La_2O_3$, $HfLaO_z$, $LaAlO_z$ and $LaSiO_z$, and any one of nitrides or nitrogen oxides of the above-mentioned materials. But the dielectric material is not limited to the above-mentioned types, and can be reasonably selected by those skilled in the art according to the prior art. The structure according to the present disclosure ensures good electrical conductivity through such a design of double electrode layers.

In the memory cell of the present disclosure the storage node contact 210 has a first surface and a second surface facing each other. The transistor is disposed on one side of the storage node contact 210 away from the capacitor and in contact with the second surface. The transistor includes an active region structure 120 in contact with the second surface, and the active region structure 120 has a third contact surface in contact with the storage node contact 210. Preferably, the second surface has an area larger than an area of the third contact surface.

In a preferred implementation, the transistor includes an active region structure 120 and a gate structure 150. The active region structure 120 includes source and drain regions and a channel region 122. The source and drain regions include a first doped region 121 and a second doped region 123; the channel region 122 is disposed between the source region and drain region; the gate structure 150 is disposed around the channel region 122; and the storage node contact is disposed on the source or drain region. Along a direction perpendicular to an extension direction of the channel region 122, any cross section of the storage node contact has an area larger than an area of any cross section of the channel region 122.

Exemplarily, any cross section of the storage node contact 210 along the direction perpendicular to the extension direction of the channel region 122 has a width larger than 1.1 times of a width of the gate structure 150. For example, any cross section of the storage node contact 210 has a width that is 1.5 times, 2 times or 3 times of the width of the gate structure 150. When the ratio of the widths of the two cross sections is greater than 1.1 times, a low contact resistance can be maintained.

Figure 2:
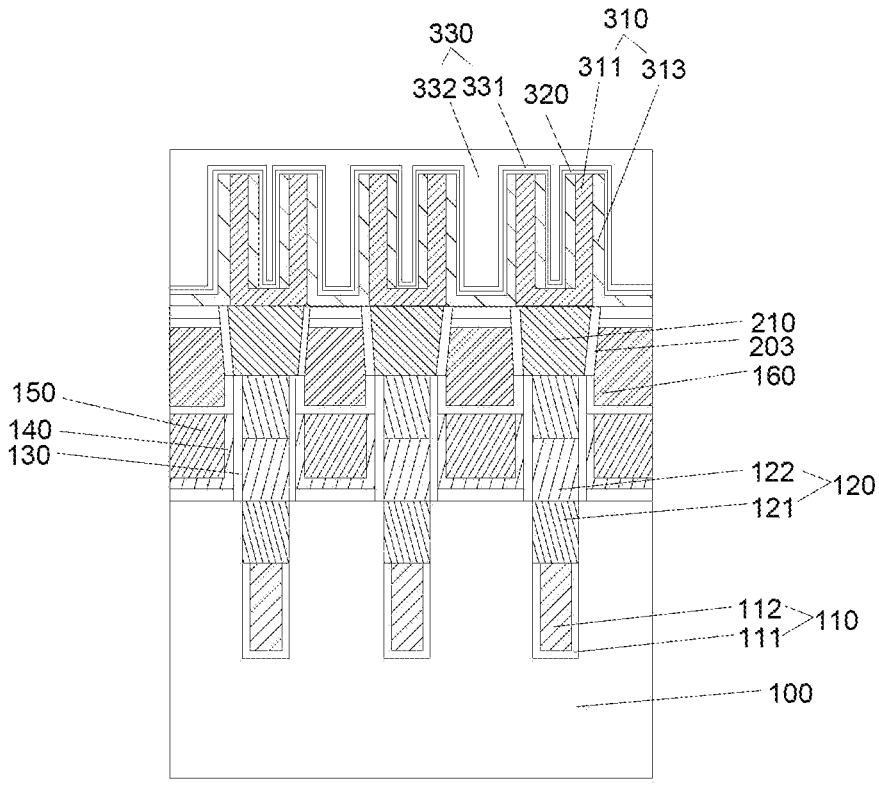
FIG. 2 is a cross-sectional structural diagram of a memory cell in a B-B' direction according to an embodiment of the present disclosure, where an A-A' direction is perpendicular to a B-B' direction.

In some implementations, along a direction parallel to the second surface, any cross section of the storage node contact 210 has an area larger than an area of any cross section of the active region structure 120, as illustrated in FIG. 1 and FIG. 2. For example, an area of a cross section of the storage node contact 210 that is parallel to the second surface increases in a direction away from the transistor.

Exemplarily, the active region structure 120 includes a first doped region 121, a channel region 122 and a second doped region 123, which are sequentially connected along a direction away from the bit line structure 110. The first doped region 121 is a drain region and the second doped region 123 is a source region. In this case, the source region of the transistor is in contact with the storage node contact 210, and the drain region is disposed on one side of the drain away from the storage node contact 210 and used for contacting with the bit line structure 110, as illustrated in FIG. 1 and FIG. 2. However, the active region structure is not limited to the above-mentioned form, the first doped region 121 may be a source region and the second doped region 123 may be a drain region. In this case, the drain region of the transistor is in contact with the storage node contact 210, and the source region is disposed on one side of the source away from the storage node contact 210 and used for contacting with the bit line structure 110, which is not limited herein.

The source region and the drain region above can be P-type doped region or N-type doped region. The N-type doped source region and the N-type doped drain region are formed by ion implantation of N-type dopants, such as phosphorus, arsenic, nitrogen and antimony; and the P-type doped source region and the P-type doped drain region are formed by ion implantation of P-type dopants, such as boron, aluminum, gallium and indium.

The above-mentioned memory cell of the present disclosure may also include an insulating layer disposed around the outside of the storage node contact 210. Exemplarily, the insulating layer is a silicon nitride layer 203, as illustrated in FIG. 1 and FIG. 2. A material for forming the storage node contact 210 may for example be polysilicon, a metal and a metal compound, such as, titanium nitride and the like, which is not particularly limited herein.

According to another aspect of the present disclosure, there is also provided a memory, as illustrated in FIG. 1 to FIG. 5, including multiple memory cells, multiple bit line structures 110 and multiple word line structures 190.

Multiple memory cells are arranged in an array.

The multiple bit line structures 110 are arranged at intervals along a first direction, and the bit line structures 110 are electrically connected to the transistors.

The multiple word line structures 190 are arranged at intervals along a second direction, and are electrically connected to the transistors, where the second direction intersects the first direction.

Exemplarily, the bit line structures 110 are buried bit line structures. However, it is not limited to the above type, and the type of the bit line structures 110 can be reasonably selected by those skilled in the art according to possible structures.

In the memory of the present disclosure, in some embodiments, the bit line structure 110 is disposed on one side of the active area structure 120 away from the storage node contact 210 in the memory cell, as illustrated in FIG. 1 and FIG. 2.

The bit line structure 110 may include a first conductive layer 111 and a second conductive layer 112. The first conductive layer 111 covers a part of an inner surface of the channel; and the second conductive layer 112 is disposed in the channel and wrapped by the first conductive layer 111 to block diffusion of the second conductive layer 112 to the substrate 100, as illustrated in FIG. 1 and FIG. 2. The first conductive layer 111 may be a titanium nitride layer and the second conductive layer 112 may be metal tungsten.

According to another aspect of the present disclosure, a method for manufacturing a memory is also provided, as illustrated in FIG. 6. The method includes the following operations S101 to S105.

In S101, a substrate 100 is provided and multiple bit line structures 110 are formed in the substrate 100, where the bit line structures 110 are arranged at intervals along a first direction.

In S102, multiple transistors are formed on each bit line structure 110, where the bit line structure 110 is electrically connected to source regions or drain regions of the transistors.

In S103, multiple word line structures 190 arranged at intervals along a second direction are formed, where the word line structure 190 is electrically connected to gate structures 150 of the transistors.

In S104, a storage node contact 210 is formed on the transistor.

In S105, a capacitor is formed on the storage node contact 210, to enable the capacitor to include a lower electrode 310, an upper electrode 330 and a dielectric layer 320 disposed between the lower electrode 310 and the upper electrode 330, where the lower electrode 310 includes a first electrode layer 311 and a second electrode layer 313.

The first electrode layer 311 has a first sub-electrode region 3111 and multiple second sub-electrode regions 3112 connected to the first sub-electrode region 3111, where the first sub-electrode region 3111 is in contact with a surface of the storage node contact 210, each of the second sub-electrode regions 3112 extends along a direction away from the storage node contact 210 and has a first end face and a second end face facing each other in an extension direction, the first end face being in contact with the surface of the storage node contact 210.

The second electrode layer 313 covers at least part of a surface of the first electrode layer 311.

By adopting the method for manufacturing a DRAM of the present disclosure, the structure of the lower electrode, the dielectric layer and the upper electrode form a double-sided capacitor structure, thereby increasing an area of the capacitor. The double-sided capacitor structure can increase the storage capacity of a capacitor without increasing the size of the capacitor, thereby facilitating the integration of capacitors.

Exemplary embodiments of a method for manufacturing a DRAM provided according to the present disclosure will be described in more detail below with reference to the accompanying drawings. However these exemplary embodiments may be implemented in a number of different forms and should not be construed as being limited only to the embodiments set forth herein. It should be understood that these embodiments are provided so that the disclosure of the present disclosure is thorough and complete and that the ideas of these exemplary embodiments are fully communicated to those of ordinary skill in the art.

Figure 7:
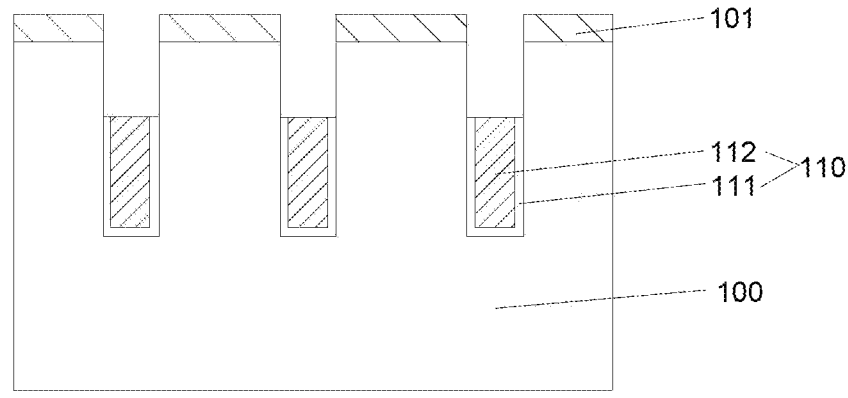
FIG. 7 is a cross-sectional structural diagram of a base after a bit line structure is formed in a substrate in a method for manufacturing a DRAM according to an embodiment of the present disclosure.
Figure 8:
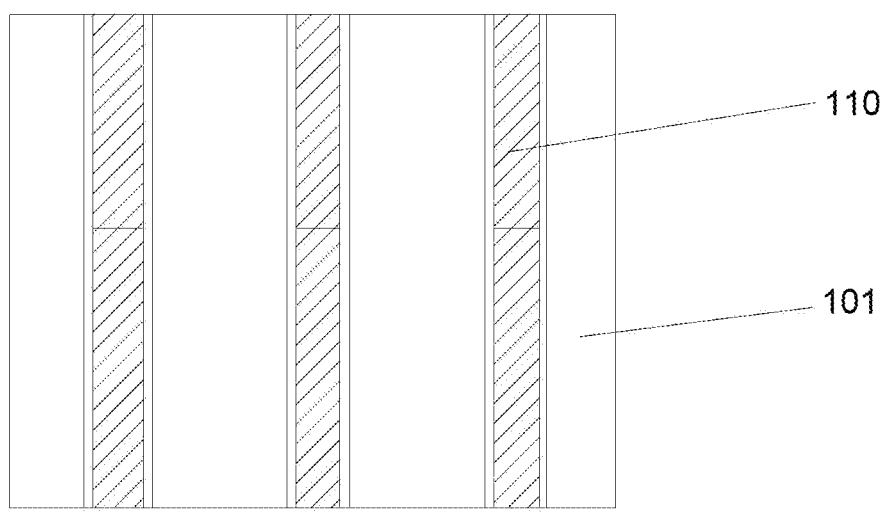
FIG. 8 is a top view of the base illustrated in FIG. 7.

Firstly, a substrate 100 is provided, and multiple bit line structures (for example buried bit line structures) 110 are formed in the substrate 100, where the bit line structures 110 are arranged at intervals along a first direction, as illustrated in FIG. 7 and FIG. 8, where the first direction is a horizontal direction in FIG. 7.

The substrate 100 may be a silicon substrate, a silicon on insulator (SOI) substrate, a germanium substrate, a germanium on insulator (GOI) substrate, a silicon germanium substrate, a Group III-V compound semiconductor substrate, or an epitaxial thin film substrate obtained by performing selective epitaxial growth (SEG), etc. The substrate 100 may be a lightly doped substrate, such as, a P-type substrate or an N-type substrate.

In some embodiments, the operation of forming multiple bit line structures 110 in the substrate 100 includes: a patterned first mask layer 101 is formed on the substrate 100 by a photolithography process, and the substrate 100 is etched through the first mask layer 101 to form multiple trenches arranged along the first direction; and the bit line structures 110 are formed in the trenches. The first mask layer 101 may be formed by a hard mask material, such as, silicon nitride.

Exemplarily, the bit line structure 110 may include the first conductive layer 111 and the second conductive layer 112. The first conductive layer 111 covers a part of an inner surface of the channel; and the second conductive layer 112 is disposed in the channel and wrapped by the first conductive layer 111 to block diffusion of the second conductive layer 112 to the substrate 100, as illustrated in FIG. 6. The first conductive layer 111 may be the titanium nitride layer and the second conductive layer 112 may be the metal tungsten.

After the operation of forming the bit line structure 110, transistors are formed on the bit line structure. Each transistor includes an active region structure 120 and a gate structure, so that the active region structures 120 are connected to the bit line structure 110, and the gate structures constitute word line structures 190 of the DRAM. The word line structures 190 are arranged at intervals along a second direction, and the second direction intersects the first direction, as illustrated in FIG. 9 to FIG. 19B.

In some embodiments, the operation of forming transistors on the bit line structure 110 includes: a source/drain region is formed on the bit line structure 110; the channel region 122 is formed; a drain/source region is formed, where the channel region is disposed between the source/drain region and the drain/source region; and the gate structure 150 disposed around the channel region is formed, where the storage node contact is disposed on the source or drain region, and along the direction perpendicular to the extension direction of the channel region 122, any cross section of the storage node contact 210 has an area larger than an area of any cross section of the channel region 122.

Figure 14:
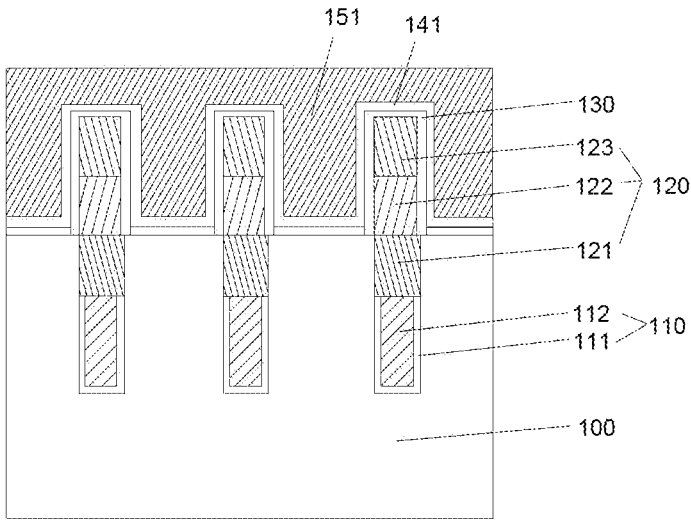
FIG. 14 is a cross-sectional structural diagram of a base after the active region structure illustrated in FIG. 13 is covered with a gate dielectric layer, a barrier material and a gate metal.
Figure 15:
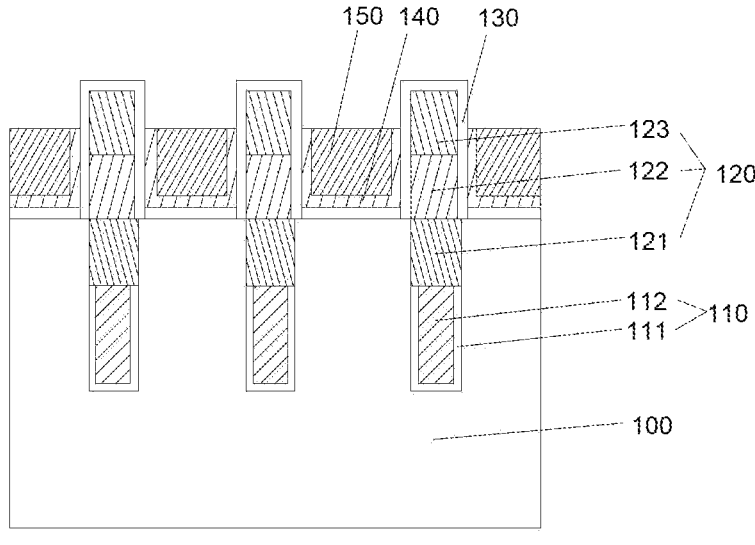
FIG. 15 is a cross-sectional structural diagram of a base after the gate metal and the barrier material illustrated in FIG. 14 are etched to form a gate and a gate barrier layer.

Exemplarily, the active region structure 120 is formed on the bit line structure 110, so that a part of the active region structure 120 protrudes from the substrate 100. The active region structure 120 has the first doped region 121, the channel region 122, and the second doped region 123 sequentially stacked along a direction away from the bit line structure 110, and the part of the active region structure 120 protruding from the substrate 100 includes the channel region 122, as illustrated in FIG. 9 to FIG. 13. The gate dielectric layer 130 disposed around the channel region 122 is formed on the substrate 100, as illustrated in FIG. 14. The gate structure 150 disposed around the gate dielectric layer 130 is formed on the substrate 100, and the gate structure 150 includes the gate barrier layer 140 and the gate dielectric layer 130, as illustrated in FIG. 15.

Figure 9:
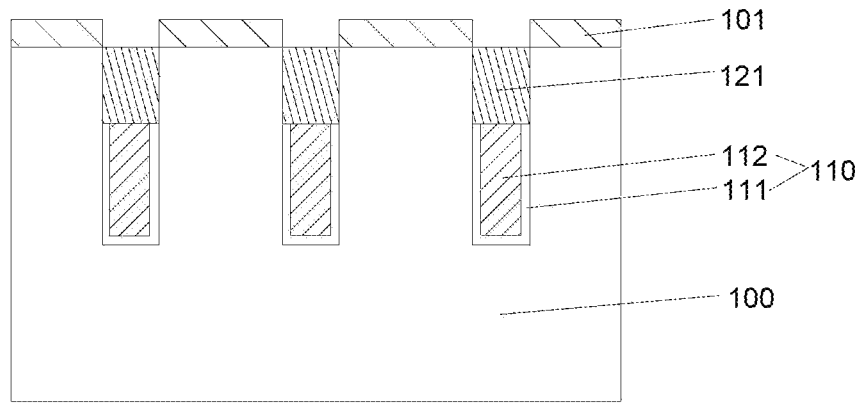
FIG. 9 is a cross-sectional structural diagram of a base after the formation of a first doped region in contact with a bit line structure in the substrate illustrated in FIG. 7.
Figure 10:
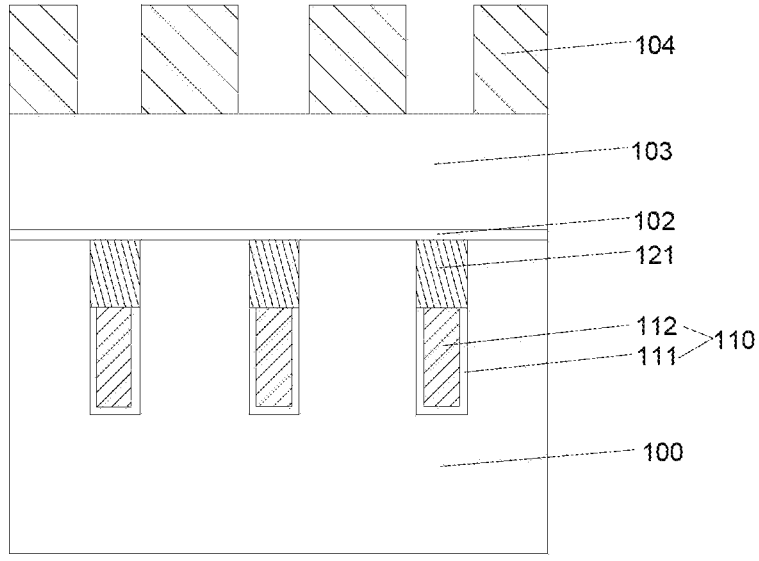
FIG. 10 is a cross-sectional structural diagram of a base after the first mask layer illustrated in FIG. 9 is removed and an etching stop layer, a first insulating layer, and a second mask layer are sequentially formed on a substrate.
Figure 11:
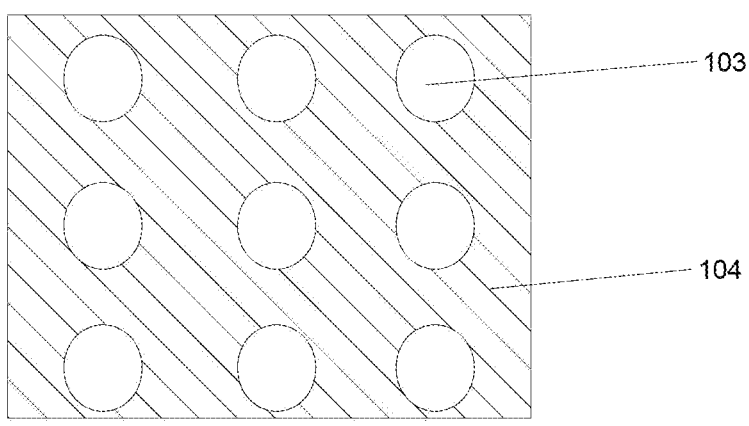
FIG. 11 is a top view of the base illustrated in FIG. 10.
Figure 12:
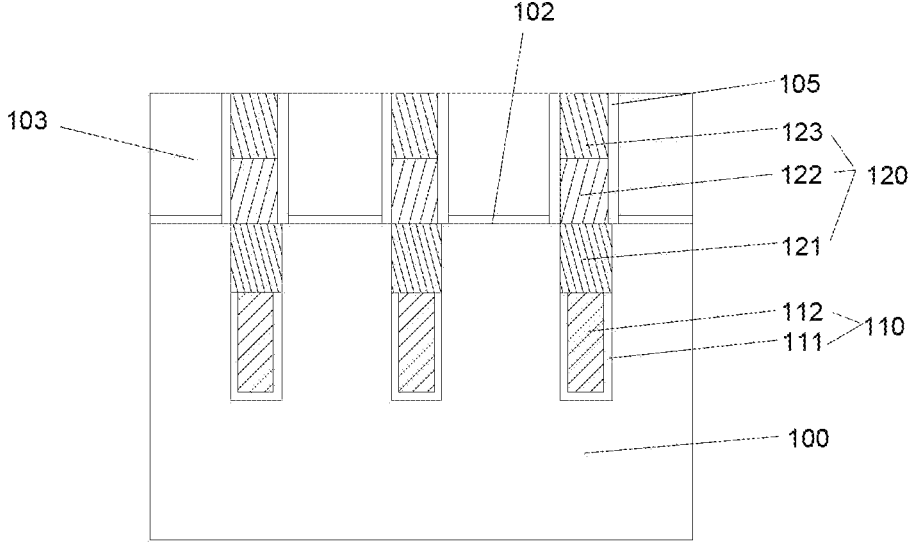
FIG. 12 is a cross-sectional structural diagram of a base after a channel region and a second doped region are formed in a through hole illustrated in FIG. 11.
Figure 13:
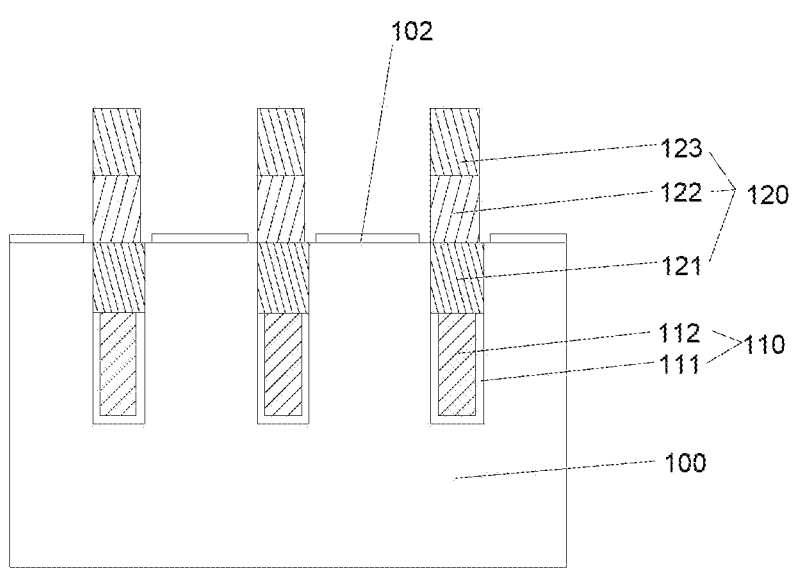
FIG. 13 is a cross-sectional structural diagram of a base after the first insulating layer and the first oxide isolation illustrated in FIG. 12 are removed.

Specifically, the operation of forming the active region structure 120 on the bit line structure 110 may include: polysilicon for example is deposited in a channel having the bit line structure 110, and ion implantation of the polysilicon is performed through the first mask layer 101 to form the first doped region 121 in contact with the bit line structure 110, as illustrated in FIG. 9; the first mask layer 101 is removed, and the etching stop layer 102, the first insulating layer 103 and multiple patterned second mask layers 104 are sequentially formed in the substrate 100 to enable the etching stop layer 102 to surround the active region structure 120, as illustrated in FIG. 10 and FIG. 11; the first insulating layer 103 and the etching stop layer 102 are sequentially etched through the second mask layer 104, to form multiple through holes communicating with the first doped region 121; a first oxide isolation 105 is formed on the inside of the through holes, the through holes are filled with, for example, polysilicon and ion implantation is performed to form a second doped region 123, and the channel region 122 is formed between the first doped region 121 and the second doped region 123 after annealing, as illustrated in FIG. 12; and the first insulating layer 103 and the first oxide isolation 105 are removed to expose the channel region 122 and the second doped region 123, as illustrated in FIG. 13.

In the above example, the first oxide isolation 105 is used to prevent ions from diffusing to the periphery during subsequent process of forming the second doped region 123 by ion implantation. The first oxide isolation 105 can also be used for reducing the loading effect in a wet etching (WET) process for removing the first insulating layer 103. The first oxide isolation 105 may be silicon oxide.

Exemplarily, the operation of forming the gate structure 150 disposed around the active region structure 120 on the substrate 100 may include: the gate dielectric layer 130 is formed on the surface of the channel region 122; a barrier material 141 is deposited on the surface of the gate dielectric layer 130; the gate metal 151 is filled in an isolation groove formed between adjacent channel regions 122, where the gate metal 151 covers the surface of the barrier layer material 141; the gate metal 151 and the barrier material 141 are etched to expose the gate dielectric layer 130, and the gate barrier layer 140 is formed by the remaining barrier material 141; the first isolation material is back filled; and the first isolation material, the gate metal, and the gate barrier layer are selectively etched, and the second isolation material is filled. Both the barrier layer material 141 and the gate metal 151 are sequentially formed on the etching stop layer 102 and the gate dielectric layer 130; the gate metal 151 and the barrier material 141 are sequentially etched to form the gate structure 150 disposed around the gate dielectric layer 130, and a part of the gate barrier layer 140 is disposed between the gate structure 150 and the gate dielectric layer 130, as illustrated in FIG. 14 to FIG. 15. In this case, the gate structure of the transistor further includes the above-mentioned gate barrier layer 140. After the operation of forming the gate structure 150 described above is performed, the etching stop layer 102 is disposed between the gate structure 150 and the substrate 100.

Figure 16:
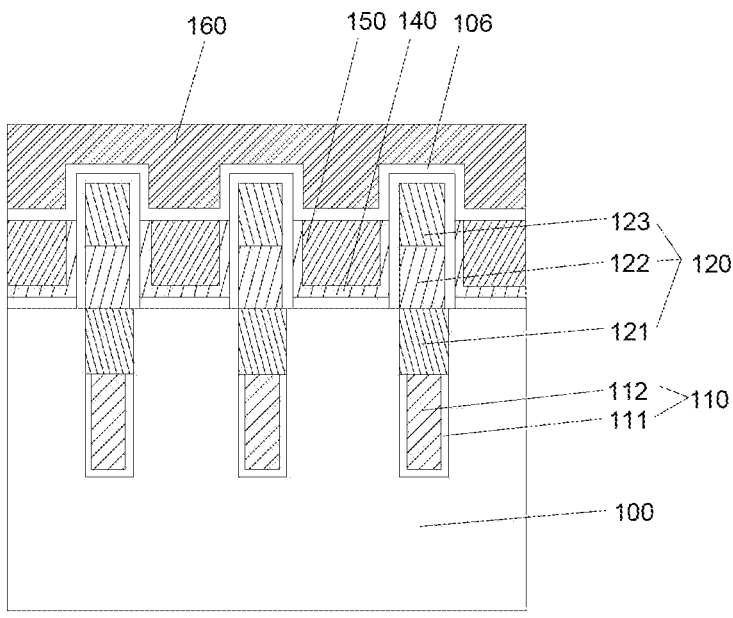
FIG. 16 is a cross-sectional structural diagram of a base after the gate and the gate barrier layer illustrated in FIG. 15 are covered with a etching buffer layer and a second insulating layer.

The first isolation material forms the etching buffer layer 106 covering the gate structure 150 and the gate barrier layer 140, and the second isolation material forms a second insulating layer 160 covering the etching buffer layer 106, as illustrated in FIG. 16.

In the above example, the gate barrier layer 140 can be used as a protective layer for the gate dielectric layer 130, the barrier layer material 141 can be titanium nitride, the gate metal 151 can be tungsten metal, and the gate metal 151 has a high etch selectivity (W/TiN>4:1) to the barrier layer material 141; and the gate dielectric layer 130 can be used as the etching stop layer 102, and titanium nitride also has a high etch selectivity (TiN/OXI>10:1) to the gate dielectric layer 130. Therefore, the end of the active region structure 120 can be prevented from being damaged during etching.

After the operation of forming the gate structure 150 is performed, the operation of forming the transistors on the bit line structure 110 may also include: multiple isolation grooves each penetrating the gate structure are formed on the substrate 100. The isolation grooves are arranged at intervals along a second direction to remove the part of the gate structure disposed between adjacent channel regions 122, so that the gate structure 150 independently surrounds the channel region 122, and the gate structure between adjacent isolation grooves constitutes the word line structure 190, as illustrated in FIG. 17 to FIG. 19B.

Figure 17:
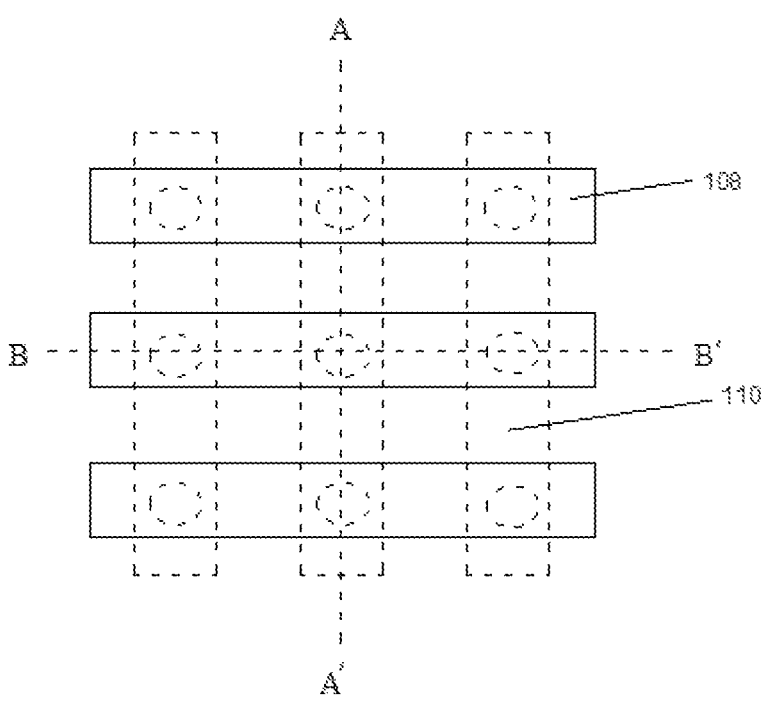
FIG. 17 is a top view of a base after a third mask layer and a patterned photoresist layer are sequentially formed on the second insulating layer illustrated in FIG. 16.
Figure 18A:
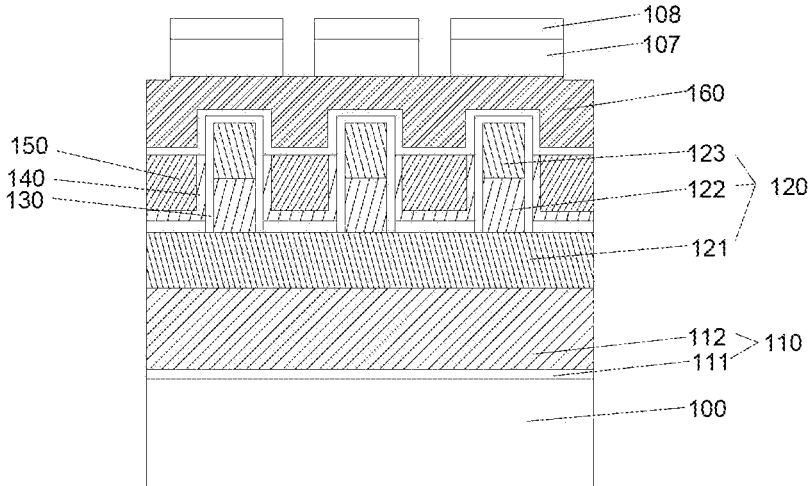
FIG. 18A is a cross-sectional structural diagram of the base illustrated in FIG. 22 in an A-A' direction.
Figure 18B:
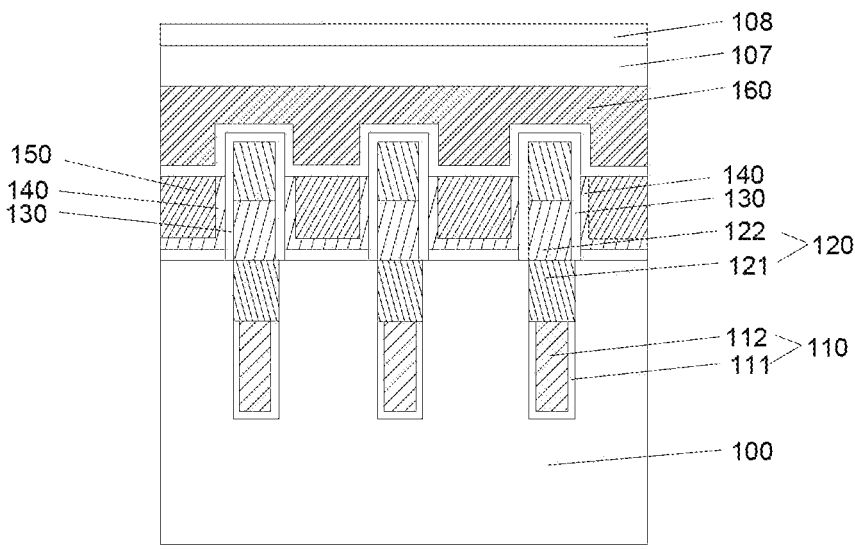
FIG. 18B is a cross-sectional structural diagram of the base illustrated in FIG. 22 in a B-B' direction.
Figure 19A:
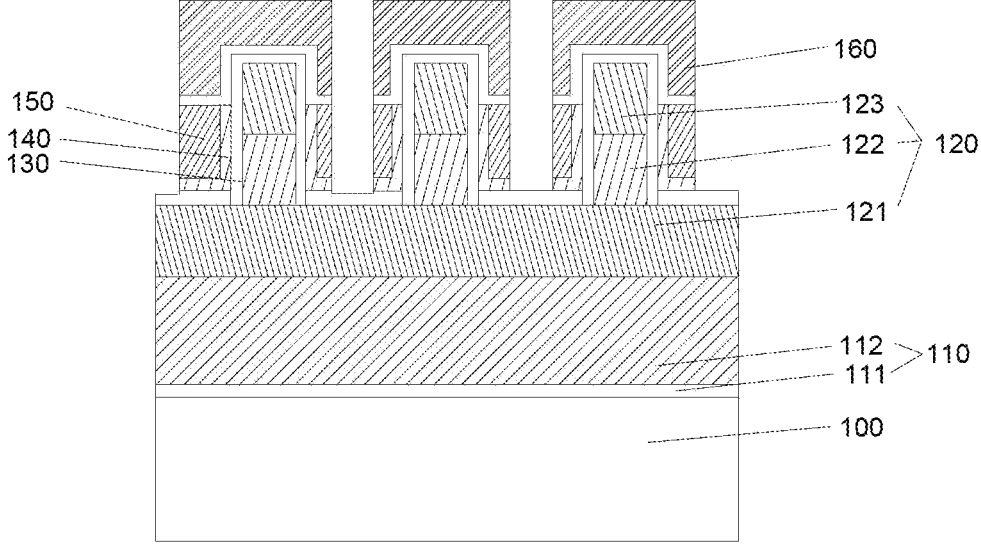
FIG. 19A and FIG. 19B illustrate cross-sectional structural diagrams of bases after multiple isolation grooves each penetrating a gate structure are formed on a substrate through the third mask layer illustrated in FIG. 18A and FIG. 18B, respectively.
Figure 19B:
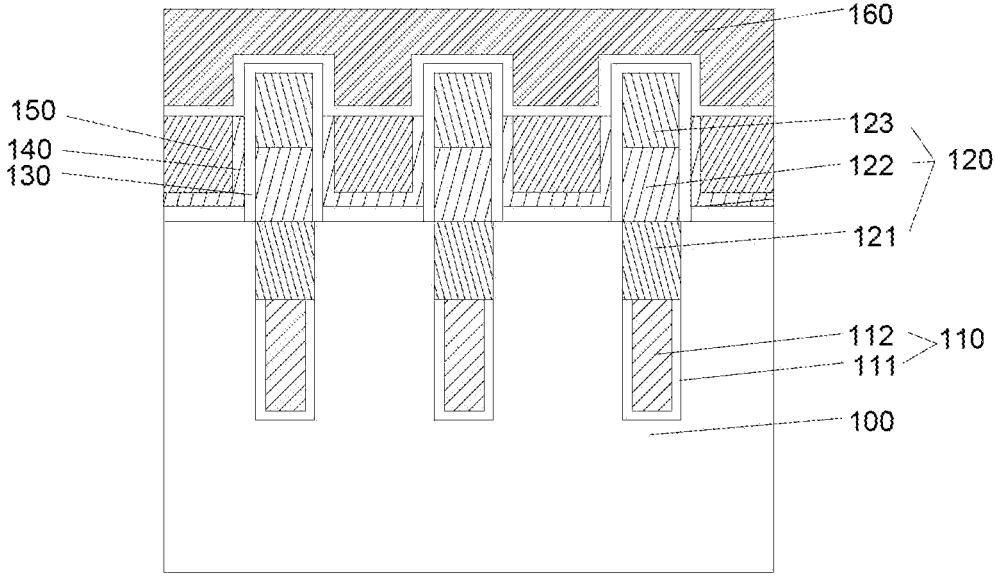

Exemplarily, the operation of forming the isolation groove in the gate structure 150 disposed between adjacent active region structures 120 includes: a third mask layer 107 and a patterned photoresist layer 108 is sequentially formed on the second insulating layer 160, as illustrated in FIG. 17 to FIG. 18B, and the patterned photoresist layer 108 has a patterned region corresponding to the isolation groove that is to be formed; and the third mask layer 107 is etched to transfer the patterned region in the patterned photoresist layer 108 to the third mask layer 107, and a patterned third mask layer 107 is formed, then the second insulating layer 160, the etching buffer layer 106, and the gate structure 150 disposed between the adjacent active region structures 120 are etched through the third mask layer 107 and the etching is stopped at the etching stop layer 102, so as to form the isolation groove, as illustrated in FIG. 19.

In the above example, the etching buffer layer 106 has a function of etching buffer in the process of forming the isolation groove by etching. The material for forming the etching buffer layer 106 can be silicon nitride, but is not limited to the above type, which can be reasonably selected by a skilled person in the art according to the prior art.

After the operation of forming transistors on the bit line structure 110 is performed, the storage node contact 210 is formed on the transistor as illustrated in FIG. 20A to FIG. 23B.

The storage node contact 210 may have a first contact surface and a second surface facing each other, and the second surface is in contact with the active region structure 120.

Figure 20A:
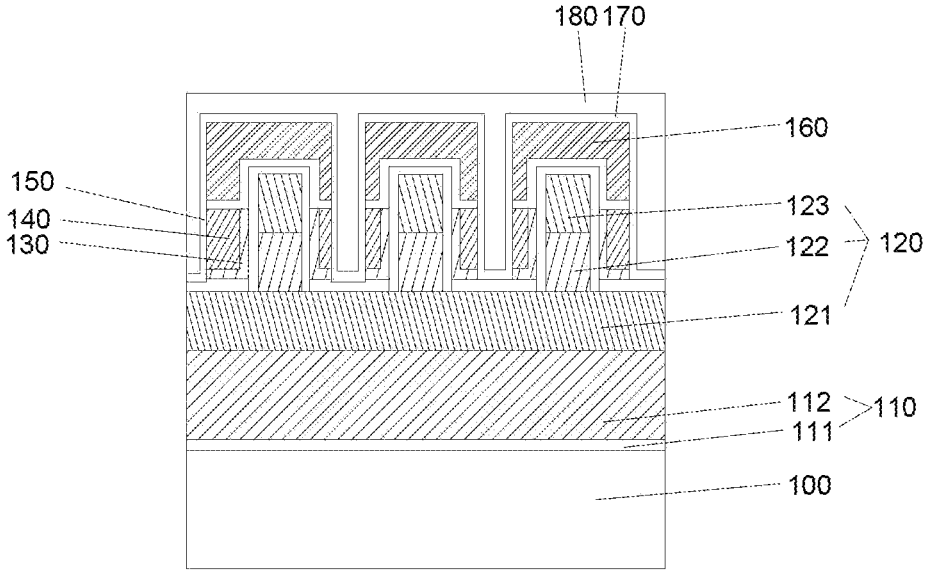
FIG. 20A and FIG. 20B illustrate cross-sectional structural diagrams of bases after a second oxide isolation and a third insulating layer are both formed in the isolation grooves and on the second insulating layer illustrated in FIG. 19A and FIG. 19B, respectively.
Figure 20B:
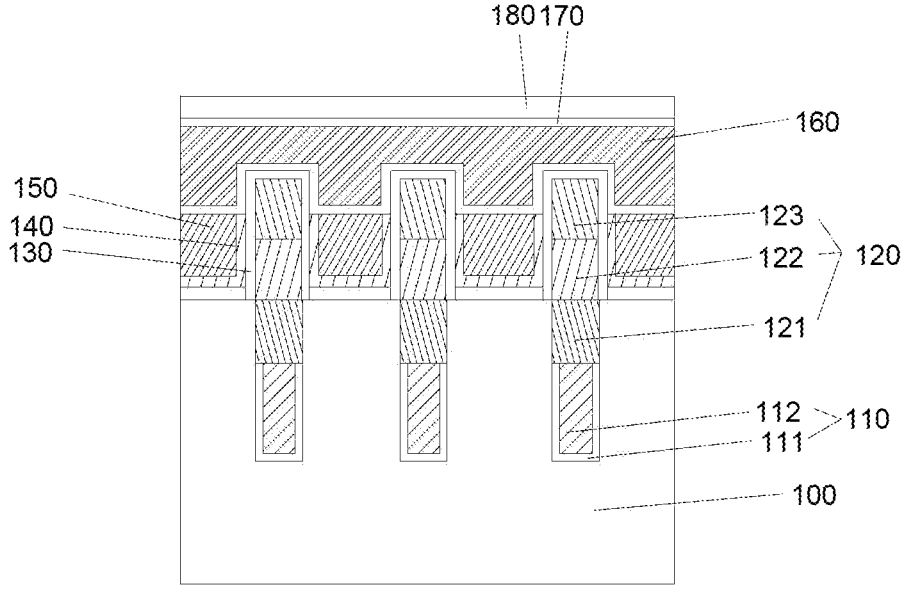
Figure 21A:
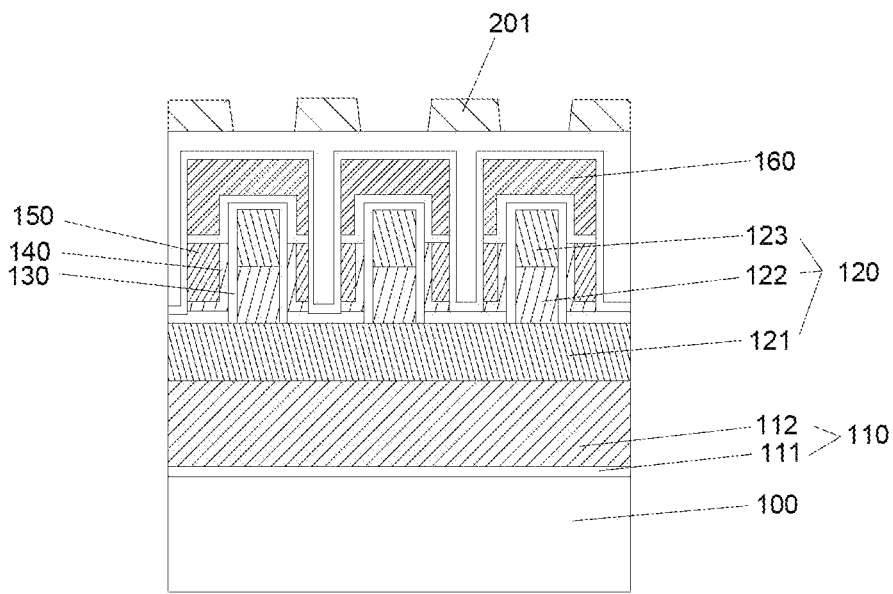
FIG. 21A and FIG. 21B illustrate cross-sectional structural diagrams of bases after a fourth mask layer is formed on the third insulating layer illustrated in FIG. 20A and FIG. 20B, respectively.
Figure 21B:
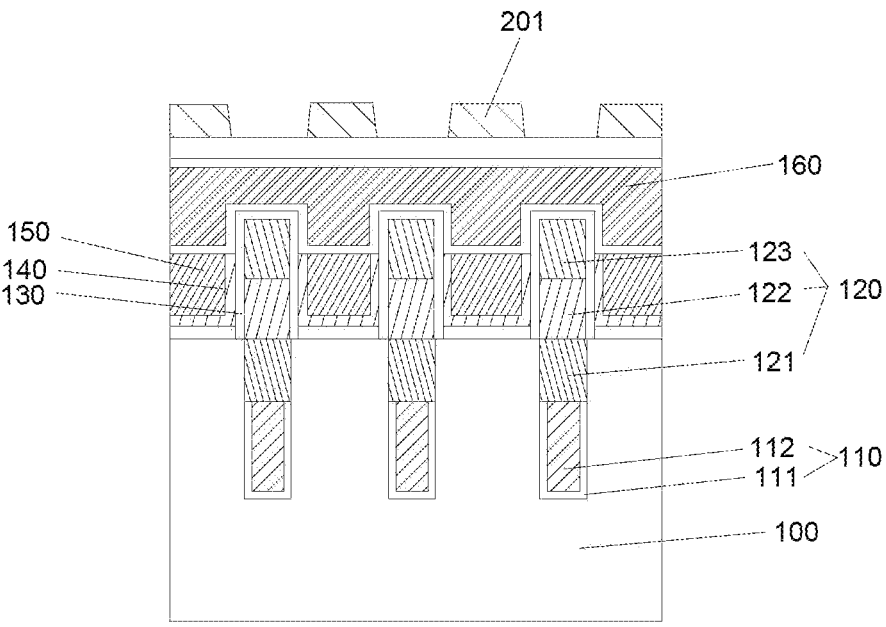
Figure 22A:
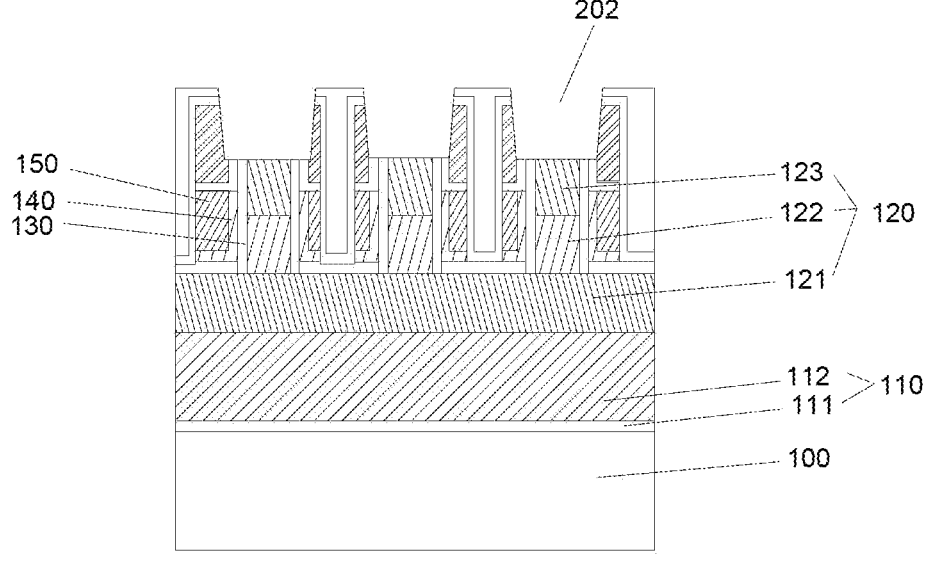
FIG. 22A and FIG. 22B illustrate cross-sectional structural diagrams of bases after a groove penetrating to a drain/source region is formed by etching through the fourth mask layer illustrated in FIG. 21A and FIG. 21B, respectively.
Figure 22B:
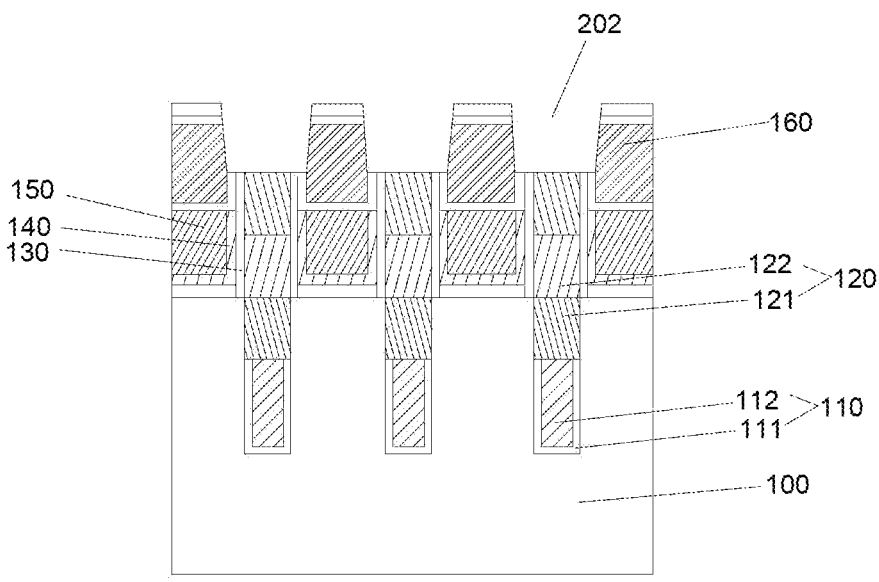
Figure 23A:
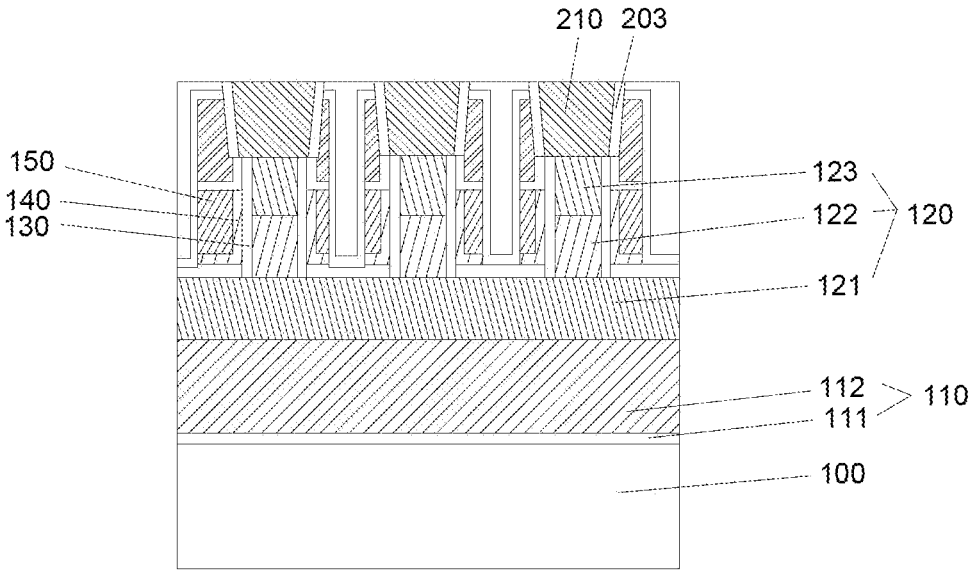
FIG. 23A and FIG. 23B illustrate cross-sectional structural diagrams of bases after a storage node contact is formed in the groove illustrated in FIG. 22A and FIG. 22B, respectively.
Figure 23B:
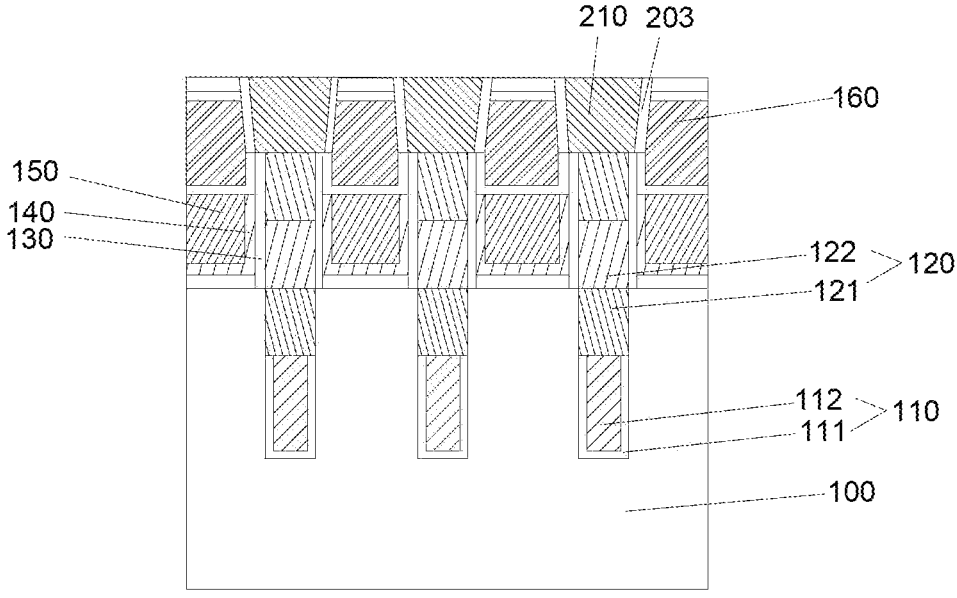

In some embodiments, the operation of forming the storage node contact 210 on the transistor includes: an interlayer dielectric layer is formed on the substrate 100, where the interlayer dielectric layer covers an exposed surface of the transistor, as illustrated in FIG. 20; the groove 202 is formed in the interlayer dielectric layer, and the groove 202 exposes the surface of the drain/source region of the transistor, as illustrated in FIG. 21A to FIG. 22B; and the storage node contact 210 is formed in the groove 202, where the storage node contact 210 includes the first surface and the second surface facing each other, and an area of a cross section of the storage node contact along a direction parallel to the second surface increases in a direction away from the transistor, as illustrated in FIG. 23. The material for forming the storage node contact 210 is described above, and will not be repeated.

Exemplarily, the operation of forming the interlayer dielectric layer covering the exposed surface of the transistor may include: the second oxide isolation 170 and the a third insulating layer 180 are formed in the isolation groove and on the second insulating layer 160, as illustrated in FIG. 20. The second oxide isolation 170 can reduce stress and parasitic capacitance of the device, and the material of the second oxide isolation 170 may be silicon oxide.

Exemplarily, the operation of forming the groove 202 penetrating to the active region structure 120 in the interlayer dielectric layer may include: a patterned fourth mask layer 201 is formed on the interlayer dielectric layer, and the fourth mask layer 201 has a patterned region corresponding to the groove 202 that is to be formed, as illustrated in FIG. 21; and the interlayer dielectric layer is etched through the fourth mask layer 201 to form the groove 202 in the interlayer dielectric layer, as illustrated in FIG. 22.

Before the operation of forming the storage node contact 210 in the groove 202 is performed, the method for manufacturing a memory according to the present disclosure may further include: an insulating layer is formed in the groove 202, and the insulating layer is disposed on the sidewalls of the groove 202. Exemplarily, a silicon nitride layer 203 covering the inner wall of the groove 202 is formed.

After the operation of forming the storage node contact 210 on the transistor is performed, the capacitor is formed on the storage node contact 210 so that the lower electrode 310 in the capacitor is contact with the first contact surface, as illustrated in FIG. 24A to FIG. 31B.

Figure 26A:
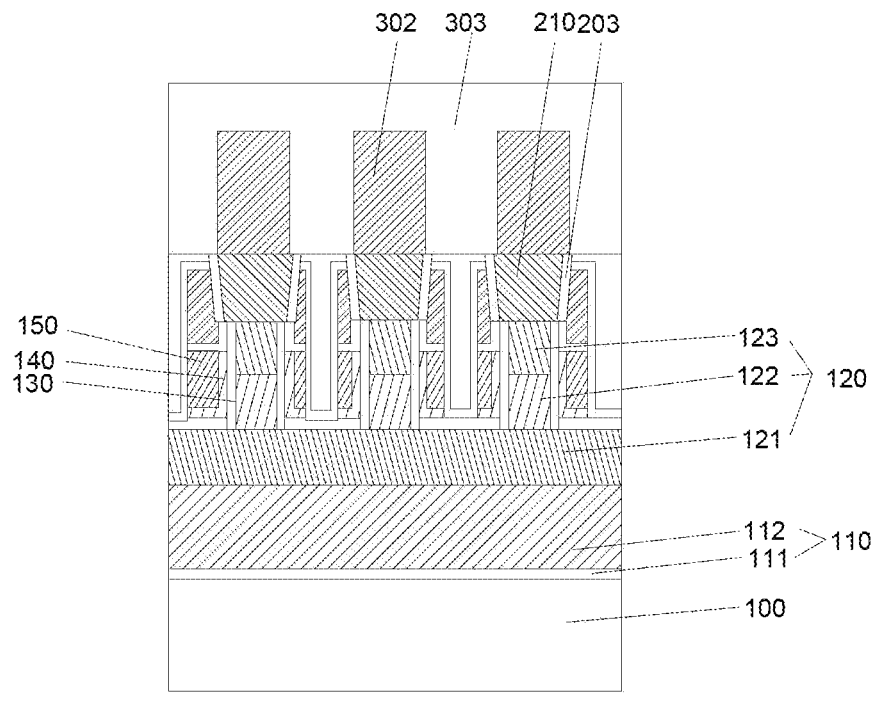
FIG. 26A and FIG. 26B illustrate cross-sectional structural diagrams of bases after a fourth insulating layer covering the capacitor pillar illustrated in FIG. 25A
Figure 26B:
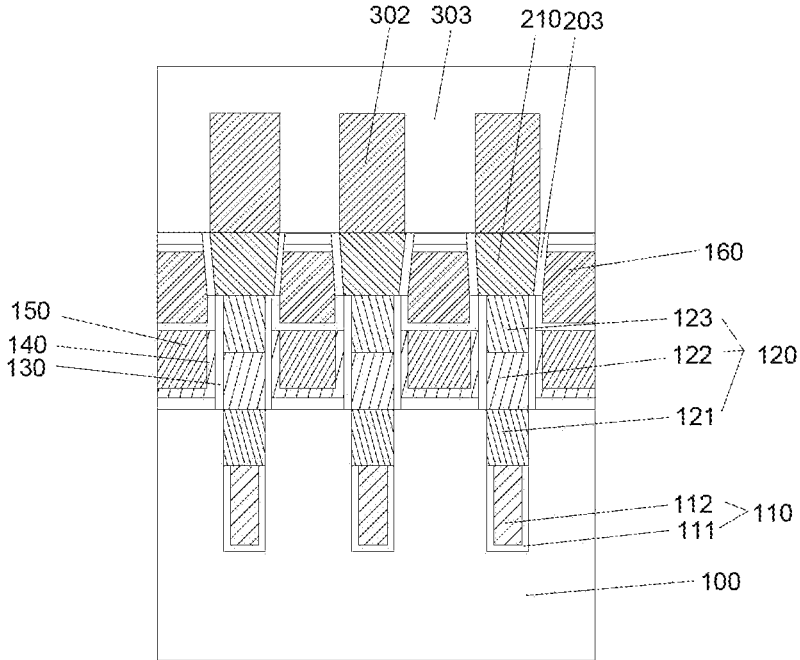
Figure 27A:
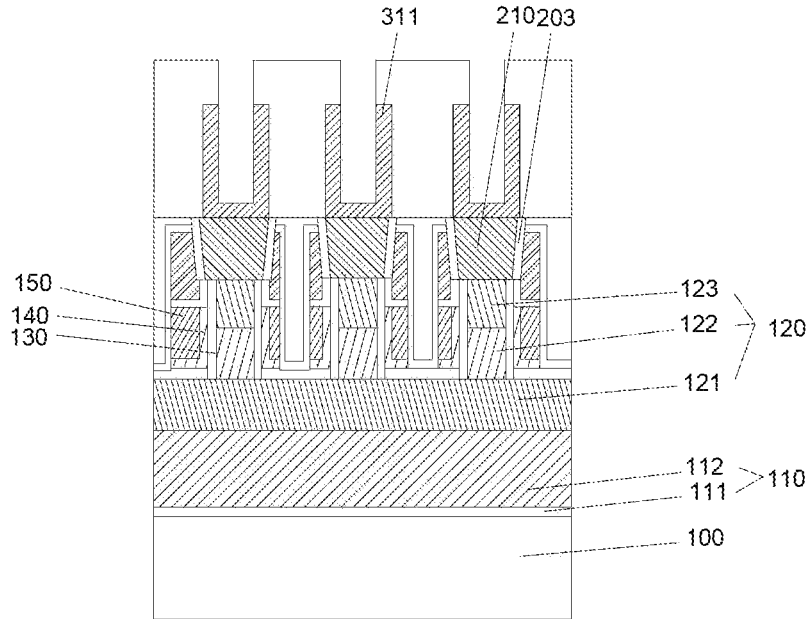
FIG. 27A and FIG. 27B illustrate cross-sectional structural diagrams of bases after the fourth insulating layer and the capacitor pillar illustrated in FIG. 26A and FIG. 26B are etched to form a first electrode layer, respectively.
Figure 27B:
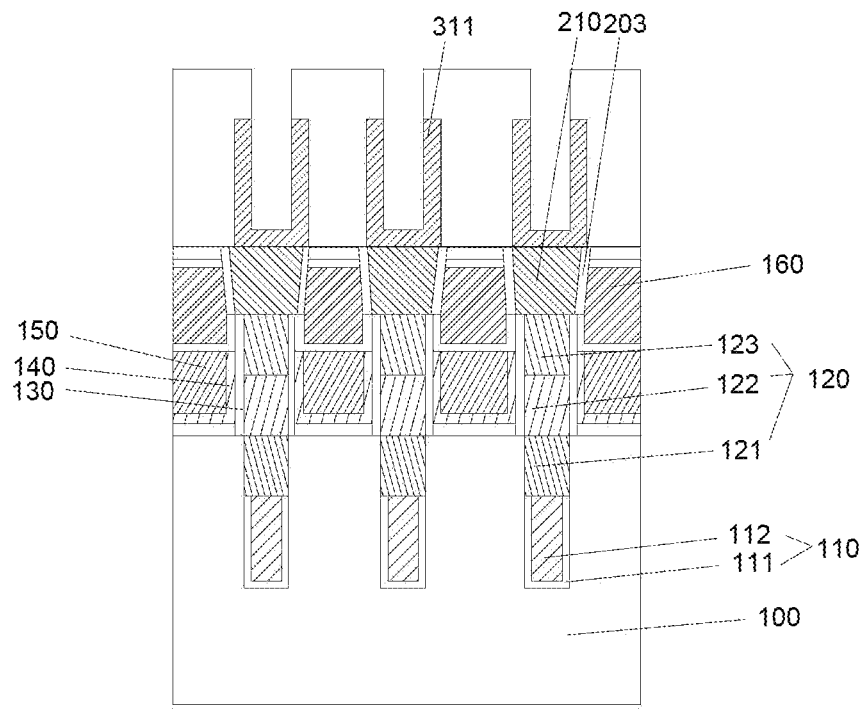
Figure 28A:
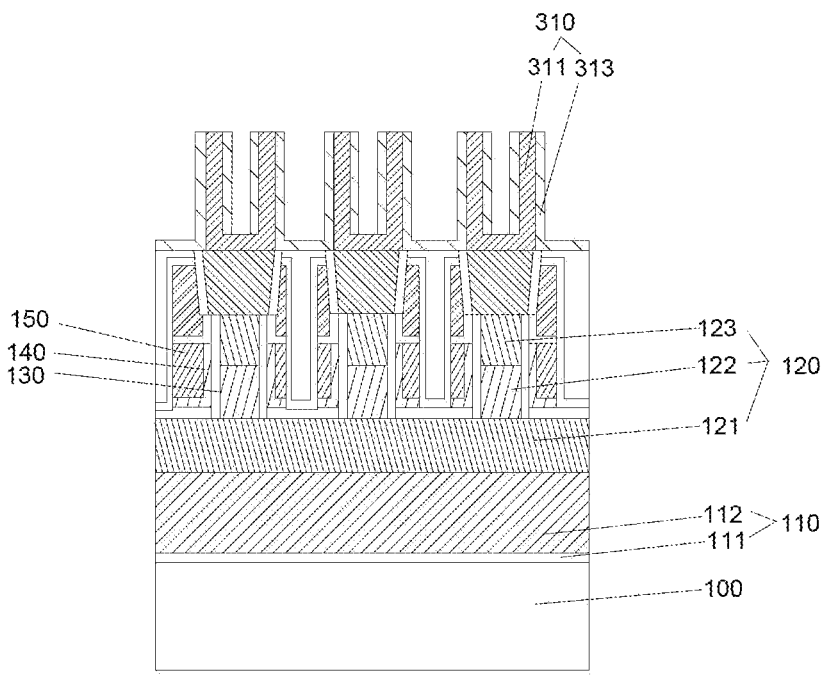
FIG. 28A and FIG. 28B illustrate cross-sectional structural diagrams of bases after a second electrode material layer covering the first electrode layer illustrated in FIG. 27A
Figure 28B:
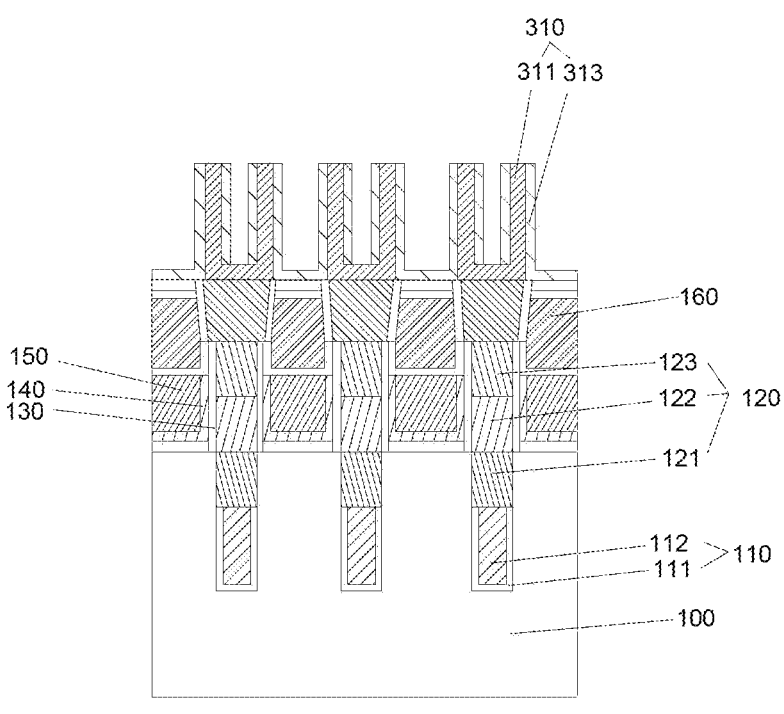
Figure 29A:
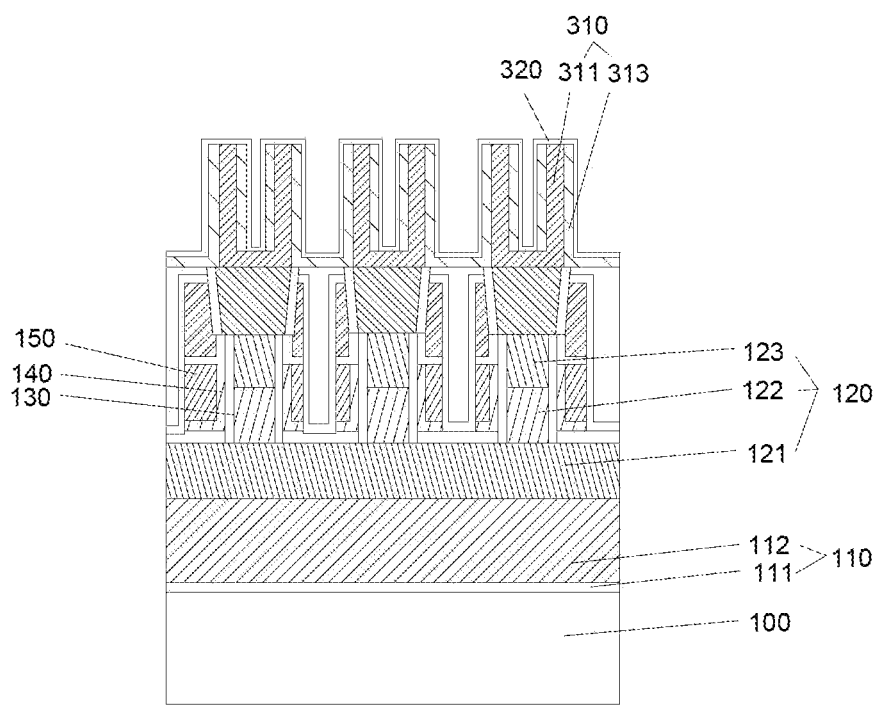
FIG. 29A and FIG. 29B illustrate cross-sectional structural diagrams of bases after a dielectric layer covering the second electrode layer and a part of the first electrode layer illustrated in FIG. 28A
Figure 29B:
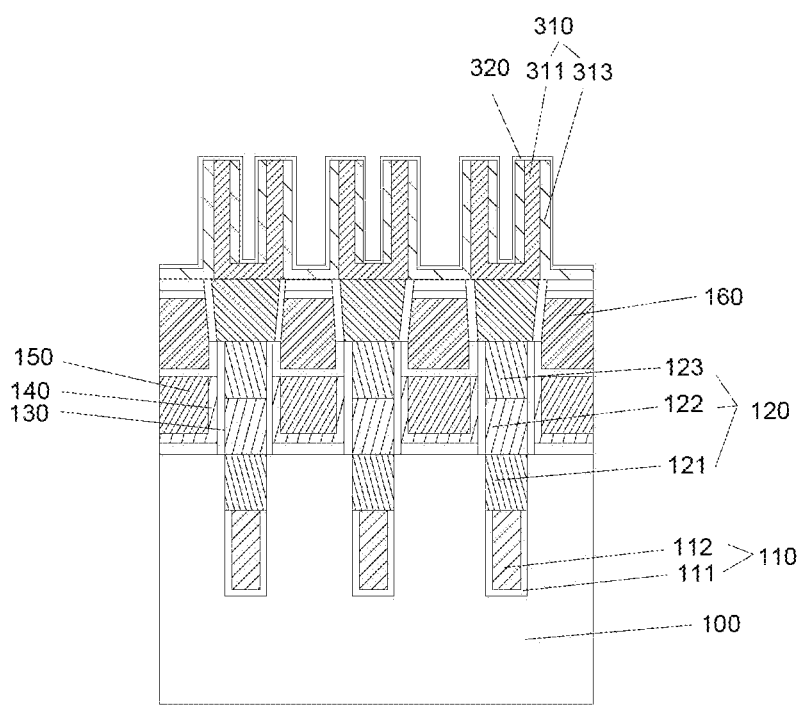

In some embodiments, the operation of forming the capacitor on the storage node contact 210 includes: a capacitor pillar 302 is formed on the storage node contact 210, and the capacitor pillar 302 may extend along a direction away from the storage node contact 210, as illustrated in FIG. 24A to FIG. 25B; the capacitor pillar is etched to form the first electrode layer 311 including a first sub-electrode region 3111 and multiple second sub-electrode regions 3112, as illustrated in FIG. 26A to FIG. 27B; an initial second electrode layer is deposited on the surface of the first electrode layer 311; the initial second electrode layer is etched back to expose a surface of the first sub-electrode region 3111 and surfaces of the multiple second sub-electrode regions 3112, so as to form the second electrode layer 313, where the first electrode layer 311 and the second electrode layer 313 constitute the lower electrode 310 of the capacitor, as illustrated in FIG. 28; the dielectric layer 320 is formed on a surface of the lower electrode 310, as illustrated in FIG. 29; and an upper electrode 330 is formed on the dielectric layer 320, as illustrated in FIG. 30A to FIG. 31B.

The first sub-electrode region 3111 covers the first contact surface of the storage node contact 210, and has a third end face away from the first contact face. One end of each second sub-electrode region 3112 is connected to the first sub-electrode region 3111, and each of the second sub-electrode regions 3112 extends along a direction away from the storage node contact 210. Each of the second sub-electrode regions 3112 has the first end face and the second end face facing each other along the extension direction, and the first end face is in contact with the first contact face.

The capacitor manufactured by the process in the above embodiments has good stability and is not prone to bending or collapse.

Figure 24A:
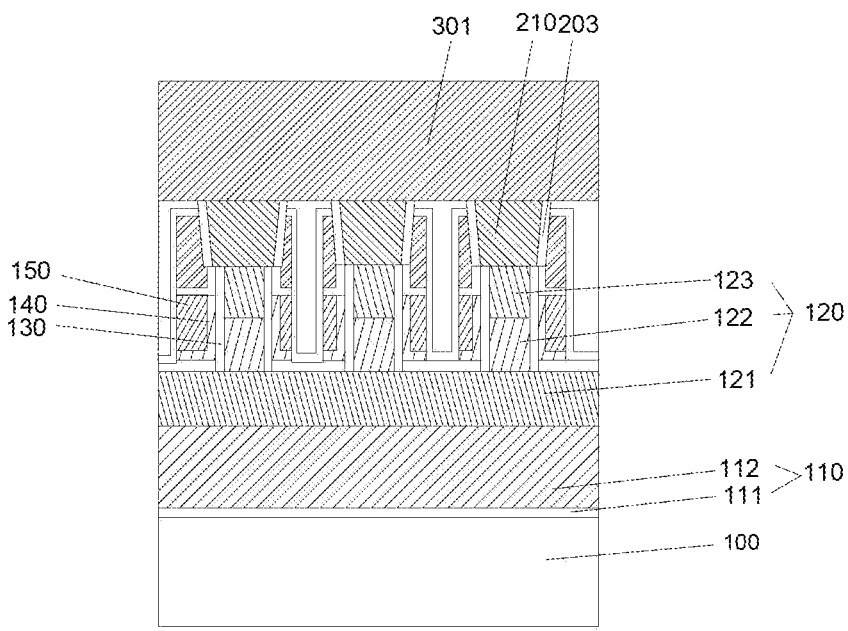
FIG. 24A and FIG. 24B illustrate cross-sectional structural diagrams of bases after the storage node contact illustrated in FIG. 23A
Figure 24B:
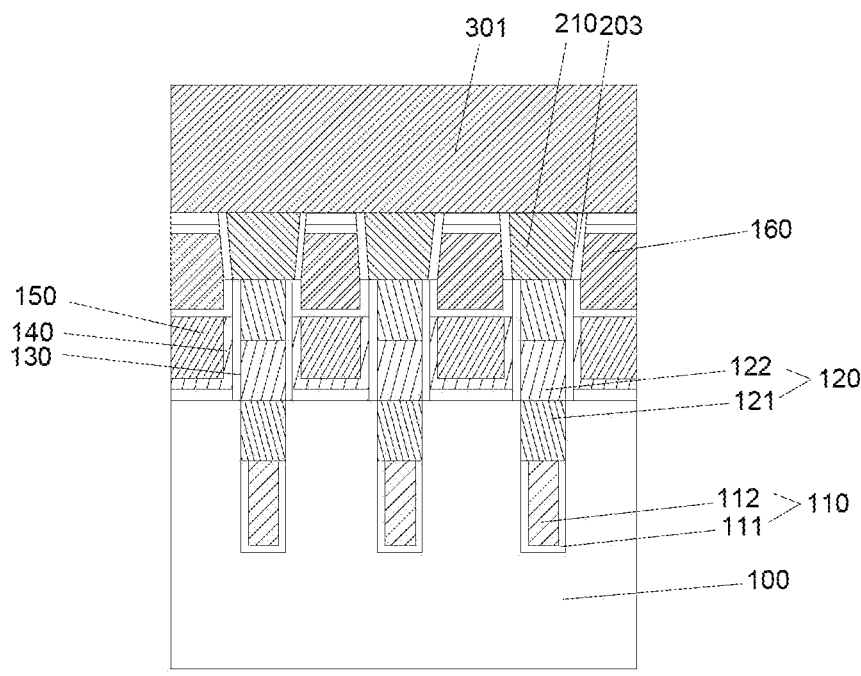
Figure 25A:
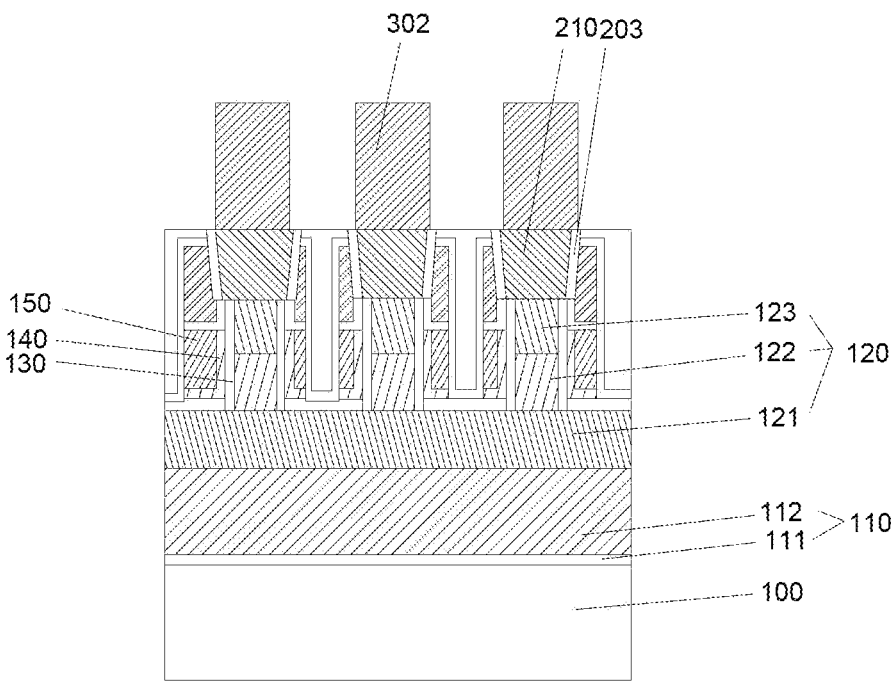
FIG. 25A and FIG. 25B illustrate cross-sectional structural diagrams of bases after the capacitive material layer illustrated in FIG. 24A
Figure 25B:
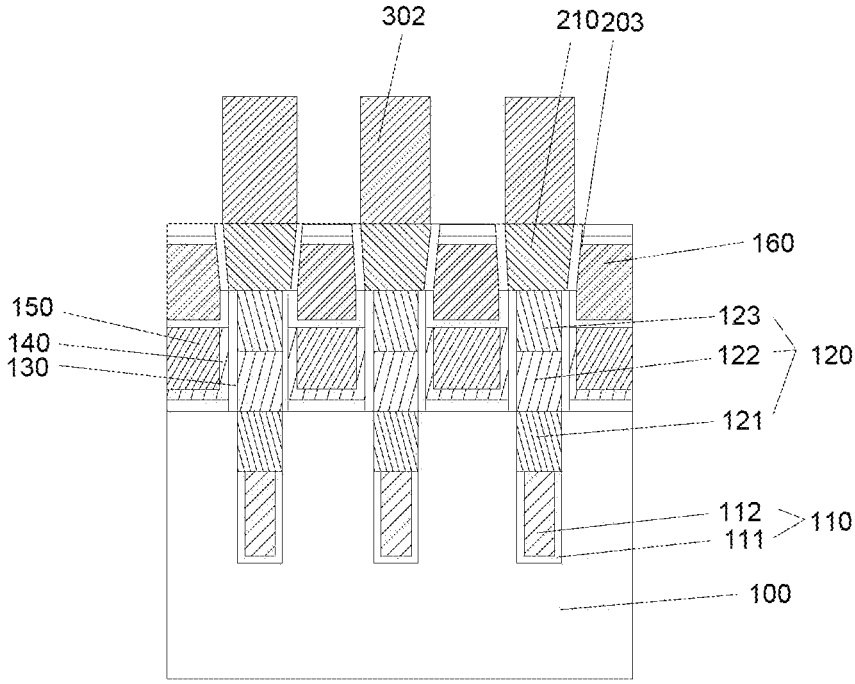

Exemplarily, the operation of forming the capacitor pillar 302 on the storage node contact 210 may include: the storage node contact 210 is covered with a capacitive material layer 301, as illustrated in FIG. 24. The capacitive material layer 301 may be formed by polysilicon; the capacitor pillar 302 is formed by photolithography and etching process, as illustrated in FIG. 25.

Exemplarily, the operation of etching the capacitor pillar 302 to form the first electrode layer 311 may include: a fourth insulating layer 303 covering the capacitor pillar 302 is formed, as illustrated in FIG. 26; an etching channel sequentially penetrating the fourth insulating layer 303 and the capacitor pillar 302 is formed by etching to etch the capacitor pillar 302, so as to form the first sub-electrode region 3111 and the multiple second sub-electrode regions 3112. In the A-A' direction and the B-B' direction, any cross section of the first electrode layer 311 constituted by the first sub-electrode region 3111 and the second sub-electrode region 3112 is U-shaped, as illustrated in FIG. 27.

Exemplarily, the operation of forming the second electrode layer 313 on the sidewalls of the second sub-electrode region 3112 may include: a second electrode material layer covering the first electrode layer 311 is formed; and the second electrode material layer is etched to form the second electrode layer 313 covering sidewalls of the second sub-electrode regions 3112, where the second sub-electrode region 3112 has a exposed second end face away from the storage node contact 210, and the first sub-electrode region 3111 has a exposed third end face away from the storage node contact 210, as illustrated in FIG. 28. After the dielectric layer 320 is formed, the dielectric layer 320 covers both the second end face and the third end face.

In the above example, the material for forming the second electrode layer 313 may be titanium nitride, but is not limited to the above type, which can be reasonably selected by those skilled in the art from possible materials.

Figure 30A:
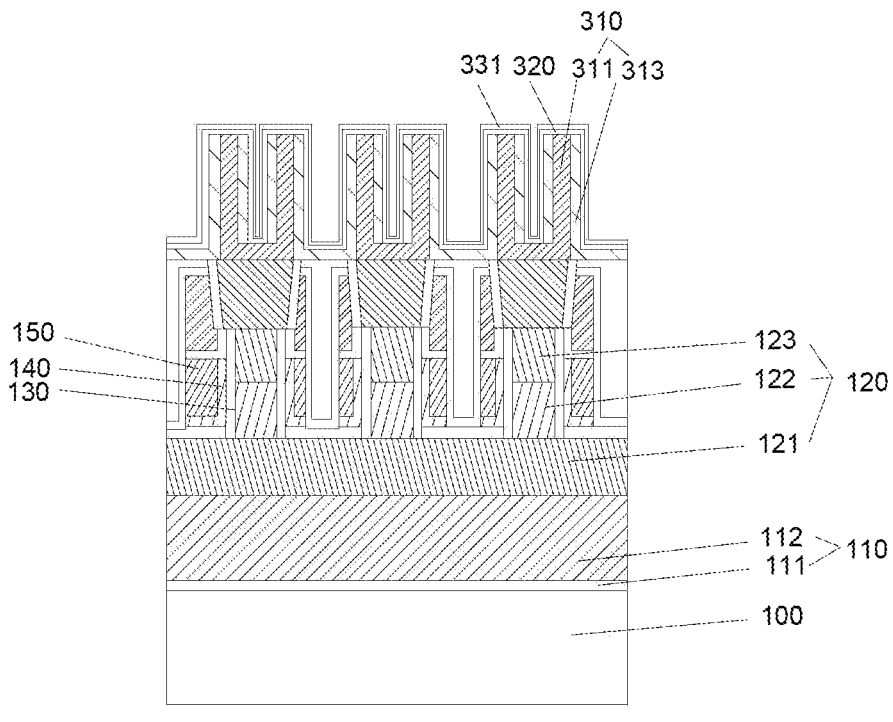
FIG. 30A and FIG. 30B illustrate cross-sectional structural diagrams of bases after the dielectric layer illustrated in FIG. 29A
Figure 30B:
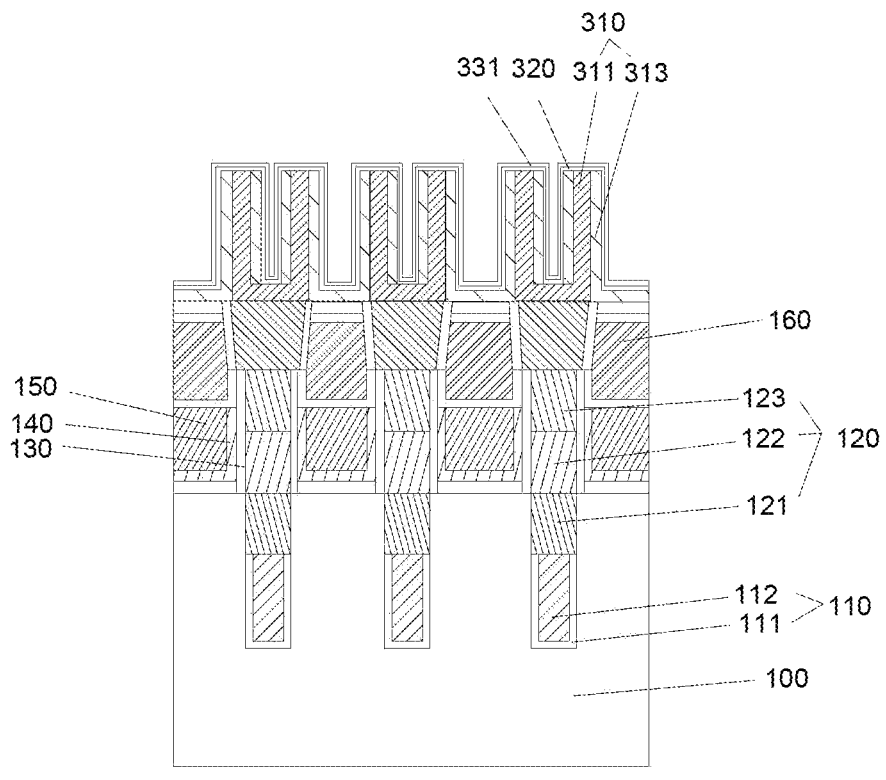
Figure 31A:
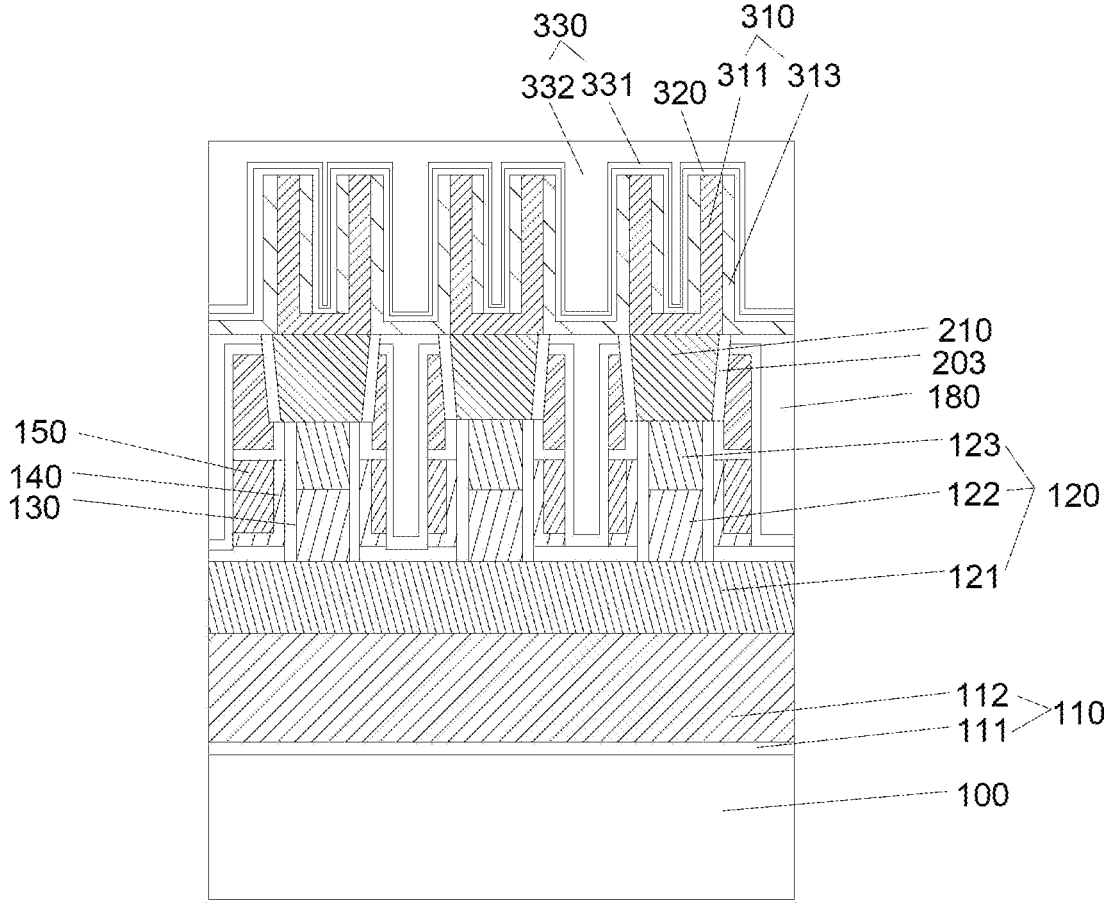
FIG. 31A and FIG. 31B illustrate cross-sectional structural diagrams of bases after the third electrode layer illustrated in FIG. 30A
Figure 31B:
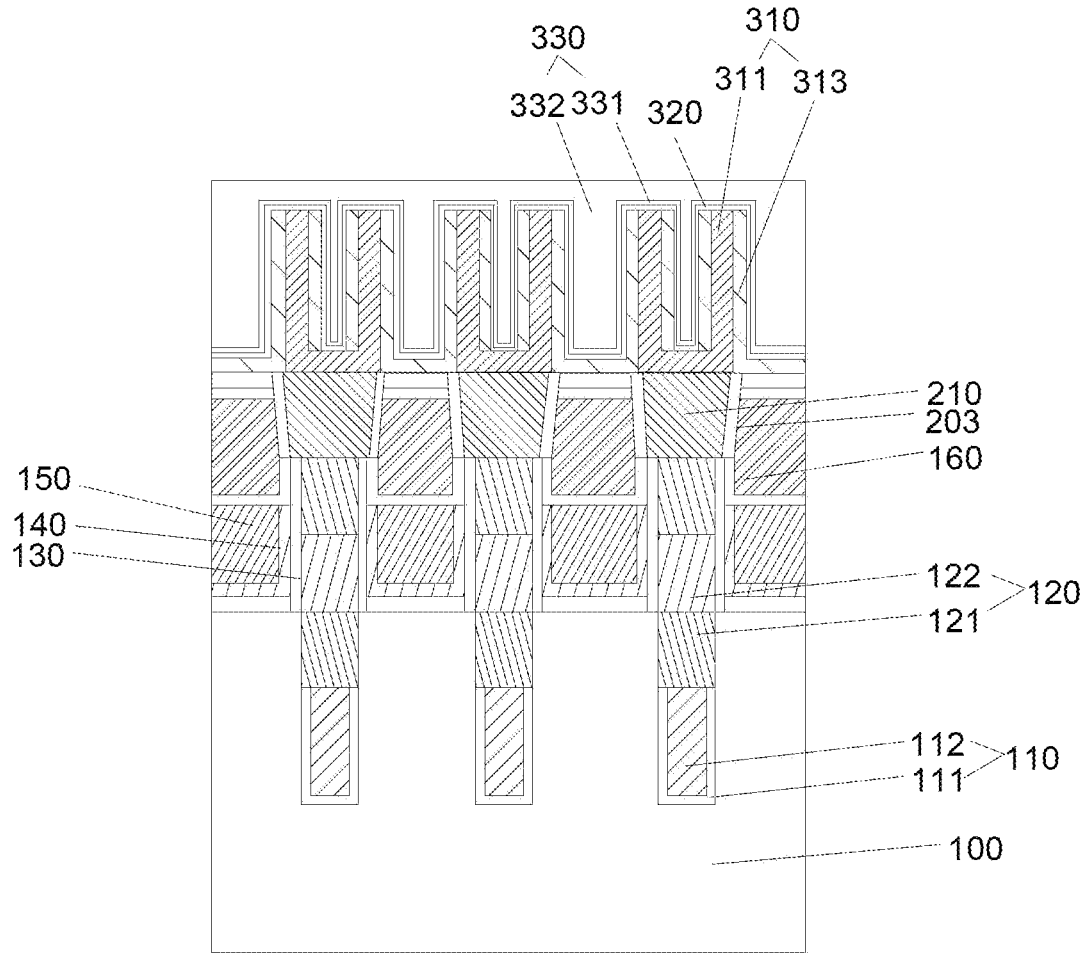

Exemplarily, the operation of forming the dielectric layer 320 with the upper electrode 330 may include: the dielectric layer 320 is covered with the third electrode layer 331, as illustrated in FIG. 30; and the third electrode layer 331 is covered with the fourth electrode layer 332, as illustrated in FIG. 31.

In the above example, the third electrode layer 331 and the fourth electrode layer 332 together constitute the upper electrode 330. The material for forming the third electrode layer 331 may be titanium nitride, and the material for forming the fourth electrode layer 332 may be germanium silicon, but not limited to the above-mentioned types, which can be reasonably selected by those skilled in the art from possible materials.

From the above description, it can be seen that the above embodiments of the present disclosure achieve the following technical effects.

1) The capacitor structure can increase the storage capacity of a capacitor without increasing the size of the capacitor, thereby facilitating the integration of capacitors.

2) A method for manufacturing the memory is also provided by the present disclosure, and the capacitor manufactured by the process in the method has good stability and is not prone to bending or collapse.

The above description is only made based on embodiments of the present disclosure, which are not intended to limit the present disclosure. For those skilled in the art, the present disclosure may have various modifications and variations. Any modifications, equivalents, modifications or the like made within the spirit and principles of the disclosure shall be included within the scope of protection of the disclosure.

What is claimed is:

1. A memory cell, comprising a transistor, a storage node contact and a capacitor that are connected sequentially, wherein the capacitor comprises a lower electrode, an upper electrode and a dielectric layer disposed between the lower electrode and the upper electrode, the lower electrode comprising:

a first electrode layer having a first sub-electrode region and a plurality of second sub-electrode regions connected to the first sub-electrode region, wherein the first sub-electrode region is in contact with a surface of the storage node contact, each of the second sub-electrode regions extends along a direction away from the storage node contact and has a first end face and a second end face facing each other in an extension direction, the first end face being in contact with the surface of the storage node contact; and a second electrode layer, covering at least part of a surface of the first electrode layer; and the transistor comprises:

source and drain regions;

a channel region disposed between the source region and the drain region; and a gate structure disposed around the channel region, wherein the storage node contact is disposed on the source or drain region, and along a direction perpendicular to an extension direction of the channel region, any cross section of the storage node contact has an area larger than an area of any cross section of the channel region, wherein any cross section of the storage node contact along the direction perpendicular to the extension direction of the channel region has a width larger than 1.1 times of a width of the gate structure.

2. The memory cell of claim 1, wherein the second electrode layer covers sidewalls of the second sub-electrode region, the first sub-electrode region has a third end face away from the storage node contact, and the dielectric layer covers the second electrode layer, the second end face and the third end face.

3. The memory cell of claim 1, wherein the upper electrode comprises:

a third electrode layer covering the dielectric layer; and a fourth electrode layer covering the third electrode layer.

4. The memory cell of claim 1, wherein the storage node contact comprises a first surface and a second surface facing each other, the first surface contacting the first electrode layer and the second surface contacting the transistor; and an area of a cross section of the storage node contact along a direction parallel to the second surface increases in a direction away from the transistor.

5. A memory, comprising:

a plurality of memory cells, each of which is as claimed in claim 1; and wherein the memory cells are arranged in an array;

a plurality of bit line structures arranged at intervals along a first direction, wherein the plurality of bit line structures are electrically connected to transistors in the plurality of memory cells; and a plurality of word line structures arranged at intervals along a second direction, wherein the plurality of word line structures are electrically connected to the transistors, and the second direction intersects the first direction.

6. The memory of claim 5, wherein the bit line structures are buried bit line structures.

* * * * *